US006939206B2

(12) United States Patent
Ashjaee et al.

(10) Patent No.: US 6,939,206 B2
(45) Date of Patent: Sep. 6, 2005

(54) METHOD AND APPARATUS OF SEALING WAFER BACKSIDE FOR FULL-FACE ELECTROCHEMICAL PLATING

(75) Inventors: Jalal Ashjaee, Cupertino, CA (US); Homayoun Talieh, San Jose, CA (US); Bulent M. Basol, Manhattan Beach, CA (US); Konstantin Volodarsky, San Francisco, CA (US)

(73) Assignee: ASM Nutool, Inc., Fremont, CA (US)

( * ) Notice: Subject to any disclaimer, the term of this patent is extended or adjusted under 35 U.S.C. 154(b) by 39 days.

(21) Appl. No.: 10/159,295

(22) Filed: May 31, 2002

(65) Prior Publication Data

US 2003/0008602 A1 Jan. 9, 2003

Related U.S. Application Data

(63) Continuation-in-part of application No. 09/910,686, filed on Jul. 20, 2001, now Pat. No. 6,855,037.
(60) Provisional application No. 60/275,406, filed on Mar. 12, 2001.

(51) Int. Cl.[7] .................................................. B24B 1/00
(52) U.S. Cl. .............................. 451/41; 451/52; 451/67; 451/286; 451/288; 451/398; 451/388
(58) Field of Search ................................. 451/285–290, 451/56, 67, 388, 398, 41, 5, 57, 54; 220/4.22; 277/647; 118/52; 134/1; 204/224 M, 277; 205/662

(56) References Cited

U.S. PATENT DOCUMENTS

| 4,043,894 A | | 8/1977 | Gibbs | |
|---|---|---|---|---|
| 5,096,536 A | | 3/1992 | Cathey, Jr. | |
| 5,294,257 A | * | 3/1994 | Kelly et al. | 118/52 |
| 5,374,594 A | | 12/1994 | van de Ven et al. | |
| 5,635,083 A | * | 6/1997 | Breivogel et al. | 216/88 |
| 5,655,677 A | * | 8/1997 | Fratello et al. | 220/4.22 |
| 5,773,953 A | | 6/1998 | Ukaji et al. | |
| 5,795,215 A | * | 8/1998 | Guthrie et al. | 451/286 |
| 5,797,789 A | | 8/1998 | Tanaka et al. | |
| 5,804,507 A | | 9/1998 | Perlov et al. | |
| 5,911,619 A | * | 6/1999 | Uzoh et al. | 451/5 |
| 5,925,411 A | | 7/1999 | van de Ven et al. | |
| 6,024,630 A | * | 2/2000 | Shendon et al. | 451/41 |
| 6,149,727 A | | 11/2000 | Yoshioka et al. | |
| 6,228,233 B1 | * | 5/2001 | Lakshmikanthan et al. | 204/277 |
| 6,290,577 B1 | | 9/2001 | Shendon et al. | |
| 6,402,851 B1 | * | 6/2002 | Piltingsrud | 134/1 |
| 6,502,833 B1 | * | 1/2003 | Shibata et al. | 277/647 |
| 6,638,145 B2 | * | 10/2003 | Hall et al. | 451/41 |
| 2002/0061716 A1 | | 5/2002 | Korovin et al. | |

FOREIGN PATENT DOCUMENTS

| EP | 1 067 590 | 1/2001 |
|---|---|---|
| EP | 1197292 A2 | 4/2002 |

OTHER PUBLICATIONS

International Search Report mailed Mar. 16, 2004, PCT/US03/17228.

* cited by examiner

*Primary Examiner*—George Nguyen
(74) *Attorney, Agent, or Firm*—Knobbe Martens Olson & Bear LLP

(57) ABSTRACT

The present invention provides a wafer carrier that includes a plurality of concentric sealing members that provide a seal, with the outer seal independently movable to allow cleaning of a peripheral backside of the wafer to occur while the wafer is still attached to the wafer carrier, and a plurality of vacuum openings that are disposed only adjacent to an inner side of the inner seal at a location corresponding to the backside periphery of the wafer.

48 Claims, 20 Drawing Sheets

METHOD AND APPARATUS OF SEALING WAFER BACKSIDE FOR FULL-FACE ELECTROCHEMICAL PLATING

This application is a continuation-in-part of and claims priority from U.S. Utility application Ser. No. 09/910,686 filed Jul. 20, 2001 now U.S. Pat. No. 6,855,037 and to U.S. Provisional Application No. 60/275,406 filed on Mar. 12, 2001 and entitled Wafer Carrier For Wet Processes.

BACKGROUND OF THE INVENTION

1. Field of the Invention

The present invention generally relates to semiconductor processing technologies and, more particularly, to a versatile wafer carrier.

2. Description of the Related Art

Conventional semiconductor devices generally include a semiconductor substrate, usually a silicon substrate, and a plurality of sequentially formed dielectric interlayers such as silicon dioxide and conductive paths or interconnects made of conductive materials. The interconnects are usually formed by filling a conductive material in trenches etched into the dielectric interlayers. In an integrated circuit, multiple levels of interconnect networks laterally extend with respect to the substrate surface. The interconnects formed in different layers can be electrically connected using vias or contacts. A conductive material filling process of such features, i.e., via openings, trenches, pads or contacts can be carried out by depositing a conductive material over the substrate including such features.

Copper and copper alloys have recently received considerable attention as interconnect materials because of their superior electromigration and low resistivity characteristics. The preferred method of copper deposition is electrodeposition. During fabrication, copper or another conductive material is deposited on a substrate that has been previously coated with a conductor, typically a barrier layer and then a seed layer. Typical seed layers are made of copper and its alloys. Typical barrier materials generally include tungsten, tantalum, titanium, their alloys, and their nitrides. The deposition process can be carried out using a variety of processes.

After depositing copper into the features on the semiconductor wafer surface, a removal process, such as an etching, an electro polishing or a chemical mechanical polishing (CMP) step, may be employed. Such removal processes remove the conductive materials off the surface of the wafer, particularly the field regions, thereby leaving the conductive materials primarily disposed within the features, such as vias, trenches and the like.

During the deposition process or the removal process the wafer is generally held by a carrier head. As shown in FIG. 1A, a conventional carrier head 10 having a rotatable shaft 12 holds a wafer 14 during the electrodeposition process. The wafer 14 is placed on a surface 16 of a carrier base 18 (chuck) of the carrier head 10. During the deposition and/or material removal step, the carrier head 10 secures the wafer 14 to the surface 16 of the base 18 of the carrier head 10 by applying vacuum to the back of the wafer and using clamps 20. The vacuum is applied using vacuum lines 22 extending through the carrier base 18 and the body of the carrier head 10. Clamps 20 may also seal electrical contacts 24 to the wafer 14. In such a conventional carrier head, because of the clamp around the periphery of the wafer, no deposition or material removal occurs at the edge of the wafer.

In use, the carrier head is immersed into a solution, typically an electrolyte in a deposition and certain material removal processes, or a slurry in a CMP material removal process, for example. In processes where moveable contact with a pad is desired, such as for polishing, such a pad will be included. During any such process, it is important to prevent leakage of the solution to the backside of the wafer. Such leakages to the backside of the wafer contaminate the wafer backside and the electrical contacts. Removal of contaminants from the wafer backside requires an extra process step that is time consuming and increases manufacturing costs.

Another conventional wafer carrier design does not use vacuum suction on the back of the wafer to retain the wafer on the carrier and attempts to reduce contamination of the wafer backside and wafer edge during processing. Referring to FIG. 1B, with such a wafer carrier 28, the back surface 30 of the wafer 32 is pressed against an o-ring 34 to form a seal between the back surface 30 of the wafer and the o-ring 34. Also, a clamp 36 including a seal 38 seals a perimeter of the front surface 40 of the wafer 32 while housing the plurality of contacts 42 to the front surface 40. In this prior art system, a region 44 behind the seal can be pressurized with gas to further prevent contamination at the wafer backside. In such designs, because of the clamp around the periphery of the wafer, no deposition or material removal occurs at the edge of the wafer.

Yet another conventional CMP head is similar to the head shown in FIG. 1A, but it holds the wafer from the back side by vacuum when positioning the wafer for processing and from the circumference of the wafer by a retaining ring during processing, thereby fully exposing the front surface of the wafer. While the CMP process is done over the front surface of the wafer, the slurry from the CMP process can nevertheless migrate toward the back surface of the wafer.

To this end, there is a need for a wafer carrier design that that may be used throughout either one or more process steps and be able to seal back of the wafer from the process solutions. There is also a need for a wafer carrier design that seals back of the wafer from the process solutions while exposing the entire front surface of the wafer for processing without excluding processing at the edge of the wafer.

SUMMARY OF THE INVENTION

It is an object of the present invention to provide an improved wafer carrier.

It is another object of the present invention to provide a wafer carrier that prevents processing liquids and contaminants resulting therefrom from reaching a backside inner region of the wafer.

It is a further object of the present invention to provide a wafer carrier that prevents processing liquids and contaminants resulting therefrom from reaching an inner region of the base and a backside inner region of the wafer.

It is a further object of the invention to minimize irregularities in polishing that are caused by using a vacuum to attach a backside of a wafer to a wafer carrier.

It is a further object of the invention to provide a method to efficiently configure a wafer carrier head to obtain a desired vacuum opening arrangement.

The present invention attains the above objects, considered singly or in combination, among others, by providing a wafer carrier that includes a plurality of concentric sealing members to provide a better seal, with the outer seal preferably being independently vertically movable to allow cleaning of a peripheral backside of the wafer to occur while the wafer is still attached to the wafer carrier and a plurality of vacuum openings that are disposed only adjacent to an inner side of the inner seal at a location corresponding to the backside periphery of the wafer.

Further, a sealing member, which is alternatively an o-ring, gasket, or inflatable member is used in combination with the vacuum holes positioned as described above to assist in preventing the processing liquids and contaminants resulting therefrom from reaching the backside inner region of the wafer as well as minimize irregularities in polishing that are caused by using a vacuum to attach a backside of a wafer to a wafer carrier.

Still further, a sealing mechanism having at least three annularly disposed sealing members is described.

As noted in more detail below, the above-described characteristics of the wafer carrier can be used on different wafer carriers that are used in various processing environments.

BRIEF DESCRIPTION OF THE DRAWINGS

The above and other objectives, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE PREFERRED EMBODIMENTS OF THE PRESENT INVENTION

Figure 1A:
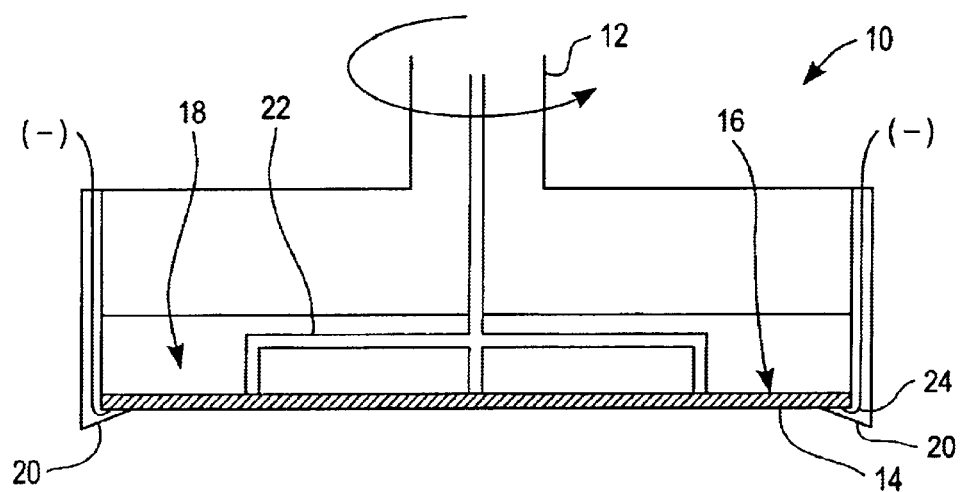
FIGS. 1A and 1B illustrate various conventional carrier heads.
Figure 1B:
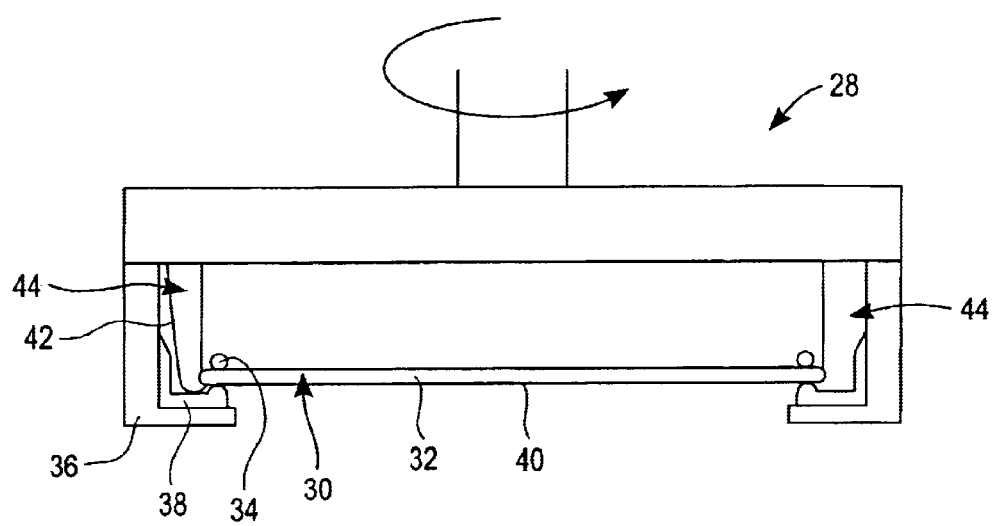
Figure 2:
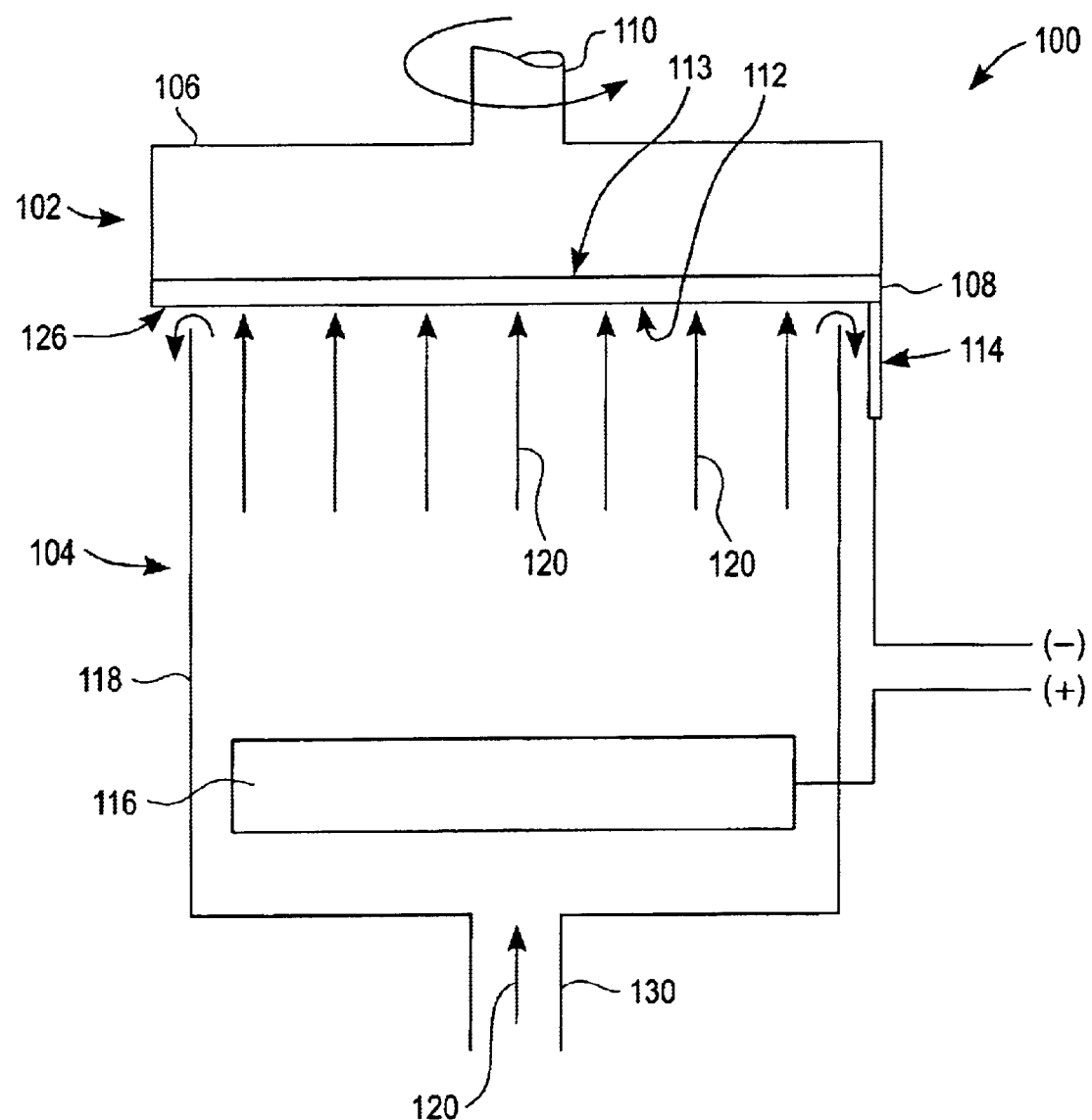
FIG. 2 illustrates an exemplary processing system on which carrier heads according to the present invention may be used.

Reference will now be made to the drawings wherein like numerals refer to like parts throughout. FIG. 2 shows an exemplary processing system 100. When used for electrodeposition, the system 100 may, for example, include a cathode assembly 102 and an anode assembly 104 and can then deposit a conductive material such as copper on a workpiece or substrate, such as semiconductor wafer. When used for material removal, the system 100 may, for example, have the polarity of the anode and cathode reversed, or instead use other processing chemicals. Further, the wafer carrier described herein can be used in a CMP process with CMP solutions, such as a CMP slurry. It should be understood that the particular process in which the present invention is used is not of particular importance. What is significant, as illustrated hereinafter, is prevention of contamination of a processing solution from reaching a backside of a wafer. And in certain embodiments, also allowing for full face processing of the wafer to occur.

It should also be noted that in the description provided below in which copper is used as an example material that is deposited during a deposition process, other conductors can also be deposited during deposition processing, for example Ni, Pd, Pt, Au, Pb, Sn, Ag and their alloys.

The wafer holding assembly 102 of the system 100 includes a wafer carrier 106, shown in FIG. 2 holding an exemplary wafer 108, which can be referred to as the cathode during deposition, the anode during electropolishing, or just the wafer if a process that does not require a current flow/voltage differential to exist. During deposition, for example, a front surface 112 of the wafer 108 is connected to a negative terminal of a power supply (not shown) by electrical contact members 114. During electropolishing, for example, the front surface 112 of the wafer 108 is connected to a positive terminal of a power supply (not shown) by electrical contact members 114.

As will be described more fully below, the wafer carrier 106 holds the wafer 108 from a back surface 113 of the wafer 108 using vacuum suction. In this embodiment, the wafer 108 is held by the wafer carrier 106 so that a front surface 112 of the wafer 108 is fully exposed. During the process, the wafer carrier 106 and hence the wafer 108 are moved by rotating a carrier shaft 110 about a rotation axis 115 or vertical axis and/or by laterally translating the carrier shaft 110.

The electrode assembly 104 of the system 100 will typically have a different type of electrode 116, depending upon whether assembly 104 is being used for deposition or electropolishing. When used for deposition, the electrode 116 is an anode, preferably a consumable copper anode, and when used for electropolishing, the electrode 116 is a cathode, and is preferably not consumable. The electrode 116 may preferably be placed into an enclosure such as an electrode cup 118. The electrode 116 may have holes that allow the electrolyte to flow therethrough (not shown). The electrode cup 118 may have bleeding openings (not shown) to control the amount of the flow of solution, such as electrolyte when used for deposition and certain electropolishing techniques, or slurry if CMP is being used, for example. During processing, the solution 120 is pumped into the electrode cup 118 through a liquid inlet 130 to reach and wet the front surface 112 of the wafer 108. The solution 120 flows in the direction of arrows and wets the front surface 112 of the wafer 108.

During deposition or certain electropolishing processes, typically the solution 120 is an electrolyte that is used to deposit material on the front surface 112 of the wafer 108 under applied appropriate potential or remove material from the front surface 112 of the wafer 108 under applied appropriate potential. During CMP, such potential may or may not be applied. With all processes, however, the wafer front surface 112 is preferably rotated as is known.

In the system 100, electrical contact members 114 contact wafer 108 on a contact region 126, as shown in FIG. 2. The contact region 126 is a peripheral ring region on the front surface of the wafer that has a portion thereof that is always exposed over the edge of the electrode cup 118 as the wafer is rotated.

Figure 3A:
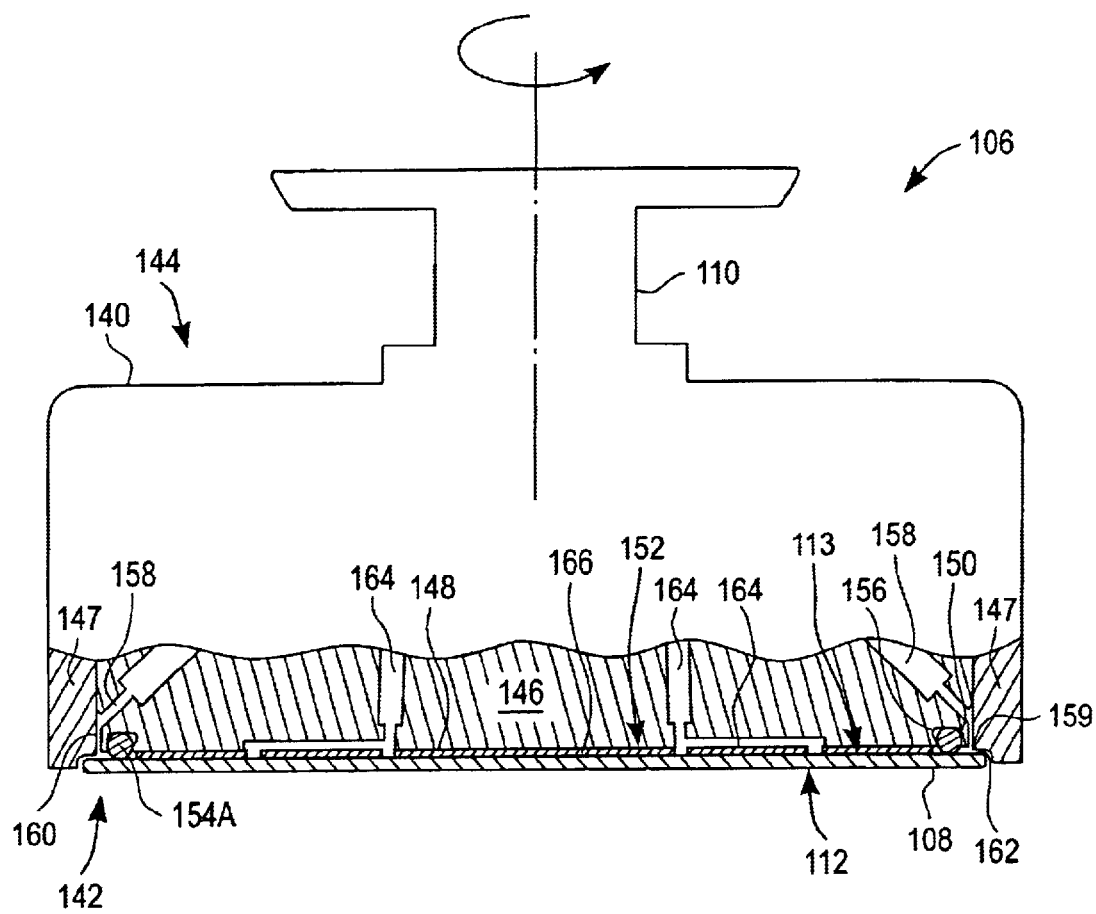
FIGS. 3A and 3B illustrate more detailed views of wafer carriers according to two embodiments of the present invention.
Figure 3B:
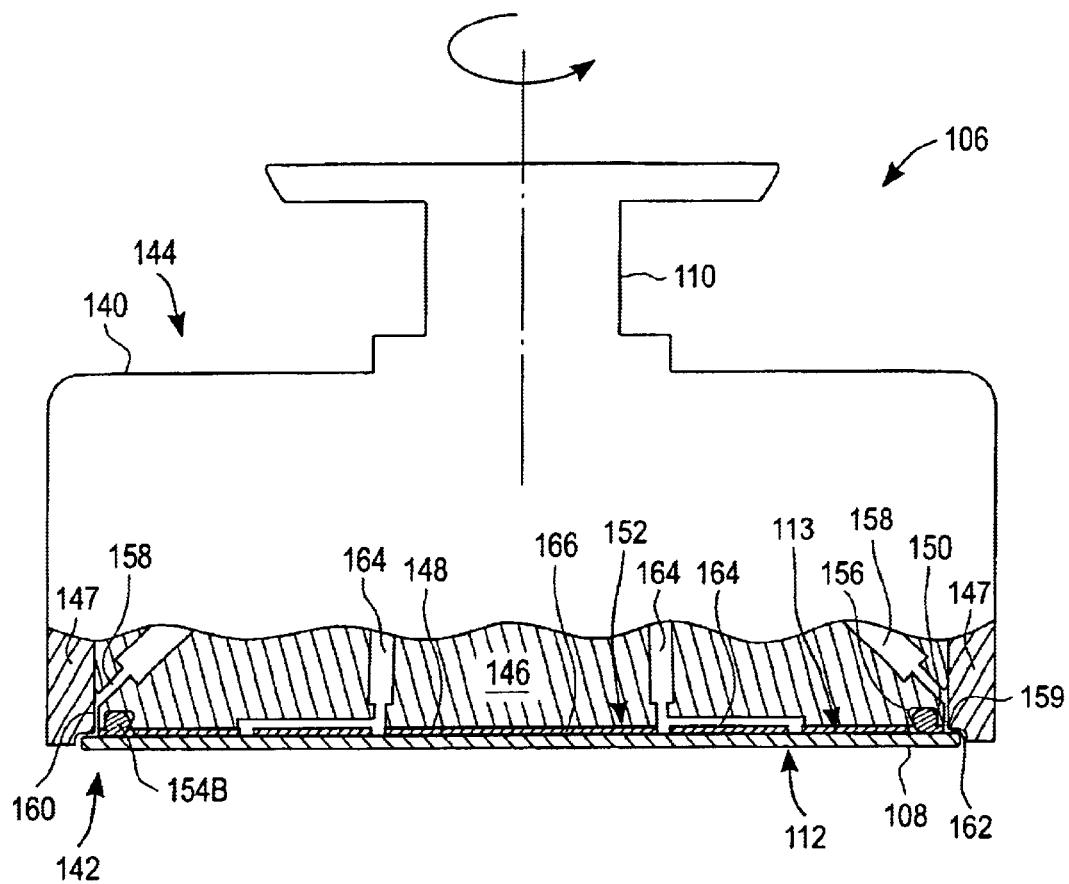

FIGS. 3A and 3B each illustrate a side view with a cut-away of the wafer carrier 106 of embodiments of the present invention in further detail. As will become apparent, the difference between the embodiments illustrated in FIGS. 3A and 3B is the type of sealing member 154 that is used. The wafer carrier 106 comprises a carrier body 140 having a lower and upper end 142 and 144. The lower end 142 of the carrier 106 comprises a carrier base 146, chuck, upon which the wafer 108 is held. The carrier base may be made of variety of materials, such as plastic, steel or titanium. And, as shown the carrier ring 147 can have a surface portion that extends below the surface of the wafer that contacts the support pad 166 described further below to prevent lateral movement of the wafer 108 beyond the surface portion that extends below the backside surface of the wafer 108. The carrier base 146 is preferably surrounded by a carrier ring 147. The carrier ring may be constructed separately or may be an integral part of the carrier base. The carrier ring may be made of plastic or any material that is stable in the process solutions. The wafer carrier 106 is rotated or moved through the shaft 110. In this embodiment, a bottom surface 148 of the carrier base 146, preferably disk shaped, includes a first surface portion 150 and a second surface portion 152. The first surface portion 150 is a peripheral surface surrounding the second surface portion 152 that is an inner region. The first and second surface portions 150, 152 of the bottom surface 148 are established by a sealing member 154 of the present invention, described hereinafter.

The sealing member 154 is placed into a circular groove 156 formed in the bottom surface 148 and between the first and second surfaces 150, 152 defines an inner region of the base 146, and, when the sealing member 154 contacts the back side of the wafer 108, establishes a backside inner region of the wafer 108. Fluid lines 158 connect a fluid supply to a plurality of outlet ports 159 on the first surface portion 150 of the bottom surface 148, as described further hereinafter. The outlet ports 159 are radially distributed around the first surface 150, such that the outlet ports are formed concentrically around the sealing member 154. Although it may be directly connected to the first surface portion 150, a lower end 160 of the fluid lines 158 may run between the carrier base 146 and the carrier ring 147. In these embodiments, the fluid lines 158 are used to blow a gas, preferably a non-oxidizing gas, onto a peripheral back edge 162 of the back surface 113 of the wafer 108. The non-oxidizing gas may preferably be nitrogen gas. Holes may have any number and varied diameters, but preferably a diameter in the range of 0.5–1 mm found most preferable. In the preferred embodiment, at 16–64 holes are disposed around the edge of the wafer carrier, for wafer sizes of between 200 and 300 mm. Of course, the number of such holes can vary, and, instead of holes, a continuous slit or slits, or another shaped opening can be used instead. The gas flow rate can vary, with a flow rate preferably between 10–60 liters per minute. As will be described more fully below, the gas emitted from ports 159 continuously sweeps the peripheral back edge 162 and provides another seal that assists in preventing liquid, such as electrolyte, from reaching behind the wafer 108 and causing unwanted contamination.

The wafer 108 is retained by the carrier base 146 by the application of vacuum suction. For this purpose, a number of vacuum lines 164 are connected to the second surface 152 of the carrier base 146. In order to support the back surface of the wafer, a support pad 166 or a backing pad is preferably, but not necessarily, attached on the second surface portion 152 to maintain the wafer in a substantially flat state while under the applied vacuum suction. When a support pad 166 is used, the vacuum lines 164 continue through holes in the support pad 166. Although in this embodiment the wafer is held by vacuum applied through the lines 164, the wafer may be held using a suction cup. In order for the seal to be created, the sealing member 154 must extend past the support pad 166, typically by an amount that is in the range of 50–100 microns, so that the seal can be properly formed. As described hereinafter, the sealing member 154 will be relatively much softer than the support pad 166.

The other components, such as mechanical components of the wafer carrier 106 may be conventionally constructed and well known in the art. The carrier head 106 may be provided with some form of gimbal mechanism and cooperating mechanical components. Such conventional components need not be further described.

In use, the wafer 108 is placed on the carrier base 146 as shown in FIGS. 3A and 3B, using a wafer handling system (not shown). The wafer 108 is aligned with the sealing member 154 and under the applied vacuum, the sealing member 154 seals the space confined between the second surface portion 152 and the back 113 of the wafer, thereby retaining the wafer 108 on the wafer carrier 106 and fully exposing the front surface 112 of the wafer 108. In the preferred embodiment, vacuum levels in the range of 400–650 Torr were employed.

Once the wafer 108 is held by the carrier 106, gas is blown through the ports 159 onto the peripheral back edge 162 as the wafer is processed during deposition, in an amount as described above.

Figure 4A:
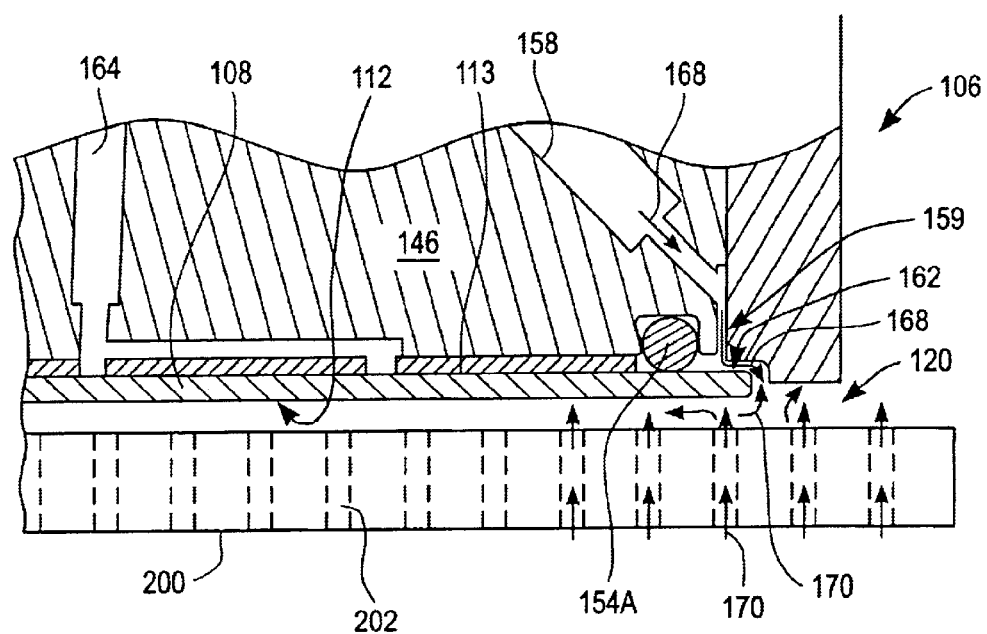
FIGS. 4A and 4B illustrate injected gas and process fluid flow using the wafer carriers according the two embodiments illustrated in FIGS. 3A and 3B of the present invention.
Figure 4B:
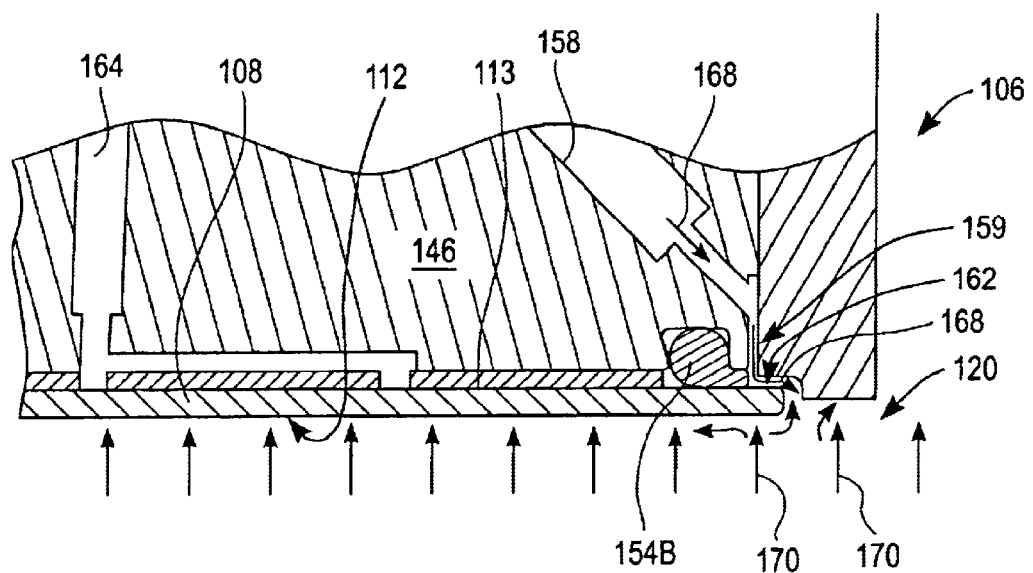

As shown in FIGS. 4A and 4B, during the above exemplified deposition process, the gas flow from the ports 159, in the direction of the arrow 168, sweeps away the electrolyte 120 flowing in the direction of the arrow 170 (delivered to the frontside of the wafer 108 through pad 200 that contains channels 202 therein) and assists in preventing the electrolyte solution from reaching the peripheral back edge 162 of the wafer 108. In cooperation with the sealing member 154, the wafer carrier of the present invention advantageously prevents the electrolyte from reaching the back surface 113 of the wafer 108 while rotating the wafer 108 relative to the pad 200 and fully exposing the front surface 112 of the wafer to the processing solutions.

In accordance with the principles of the present invention, the sealing member 154 is designed such that the sealing function is efficiently achieved with the application of minimum vacuum suction.

The sealing member 154A illustrated in FIGS. 3A and 4A is an o-ring made of an insulating material. The o-ring 154A may or may not be hollow inside, but as shown in FIG. 4A, it will tend to retain its shape under pressure. It has been found that preferably the o-ring 154A is hollow, having a diameter of 1–4 mm, and a thickness of between 0.5 and 1.5 mm. Put in other terms, there is softness to the hollow o-ring, such that it has a durometer rating of less than 70, and preferably within the range of 30–50 durometers, in contrast to typical o-rings that are much harder, and have a higher durometer rating, and support pads 166 that will have a durometer rating (which is a hardness rating) that typically are at least 5 times greater than that of the hollow o-ring. This softness advantageously allows for the desired seal to occur, without the detrimental side effect of causing bowing on the wafer due to the pressure of a hard seal exerting too much pressure onto the backside of the wafer. The o-ring 154A, particularly when hollow, is preferably made of an ethylene propylene material.

Figure 5:
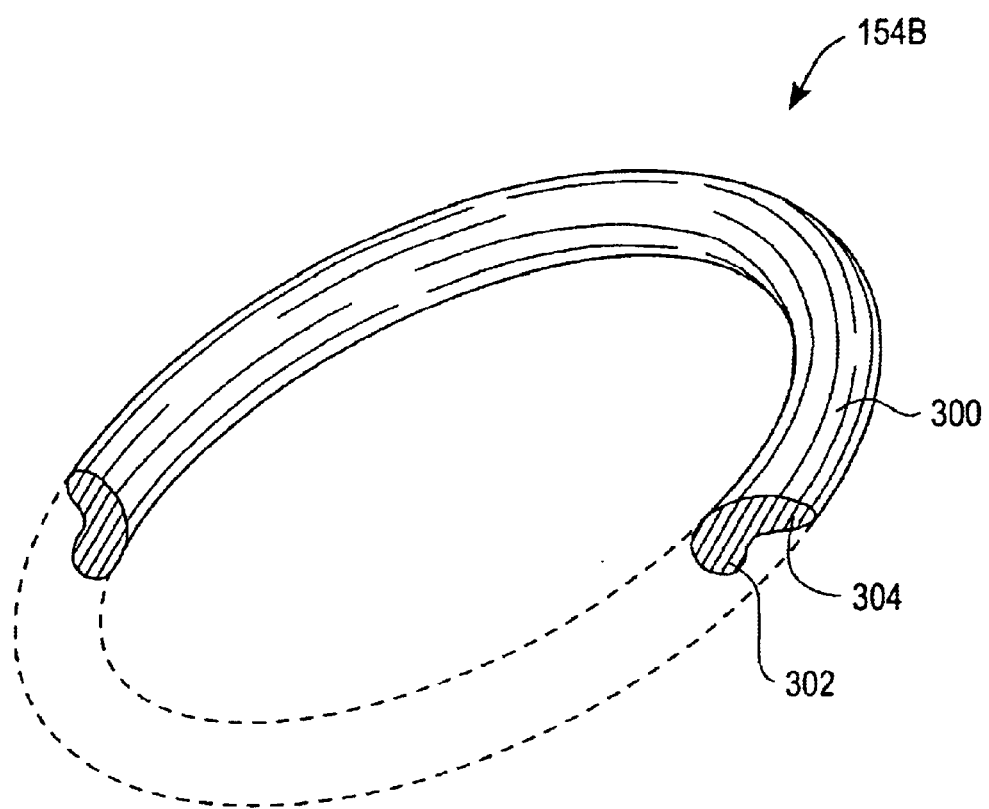
FIG. 5 illustrates a gasket member used in the embodiment of the present invention illustrated in FIGS. 3B and 4B.

The gasket 154B illustrated in FIGS. 3B and 4B is an alternative to the o-ring 154A. As shown in FIG. 5 in partial perspective view, the gasket 154B has a circular body 300 having a bulb shape cross section. The body 300 has a first portion 302 or an attachment portion and a second portion 304 or a sealing portion. The sealing portion 304 may preferably be slanted outwardly to offer more sealing surface when the vacuum is applied, which will be described more fully below.

Figure 6A:
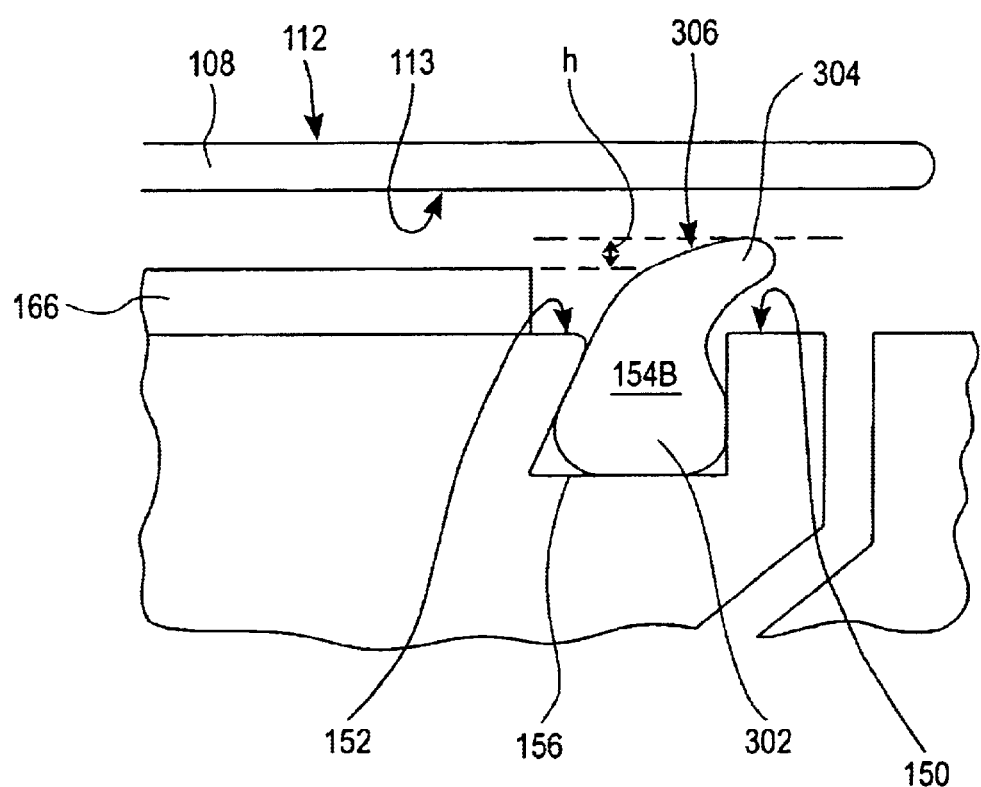
FIGS. 6A and 6B illustrate usage of the gasket member illustrated in FIG. 5 in more detail.

FIG. 6A shows the gasket 154B in cross section and with no compressive force applied upon it or no wafer held on it. Referring to FIG. 6A, the gasket 154B is placed on the wafer carrier by inserting the attachment portion 302 into the circular groove 156. The sealing portion 304 of the gasket 154B defines a sealing surface 306 which is a slanted surface generally facing the back surface 113 of the wafer 108. The sealing portion 304 is a compression distance, denoted with 'h', higher than the top of the support pad 166. The compression distance may be in the range of 0.1 mm to 0.3 mm, preferably 0.2 mm. In sealing stage, the compression distance 'h' is reduced to zero, allowing full usage of the sealing surface 306.

Figure 6B:
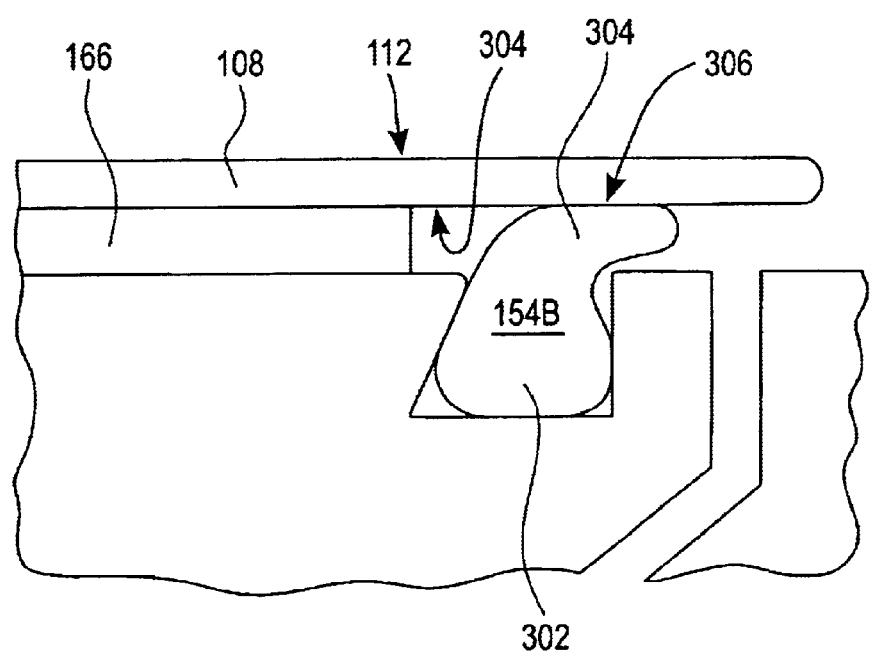

FIG. 6B shows the gasket 154B when sealing the back surface 113 of the wafer 108. As illustrated in FIG. 6B, as vacuum suction is applied to the back surface 113 of the wafer 108, the wafer 108 presses against the sealing surface 306 and causes the sealing portion 304 to collapse thereby achieving sealing function. The gasket 154B achieves sealing function with ease, i.e., by the collapse of the sealing portion 306 and with providing larger sealing surface.

In this embodiment, the gasket 154B can be made of an elastic material such as elastomer. One such material is commercially available under the brand name Kalrez™, which can be available from DuPont. It is understood, however, that although in the preferred embodiment the gasket member of the present invention is described above, the gasket member may be made of any compressible material, membrane, or tube, or the like, as long as it performs the above given sealing functions, and is within the scope of the present invention.

Figure 7A:
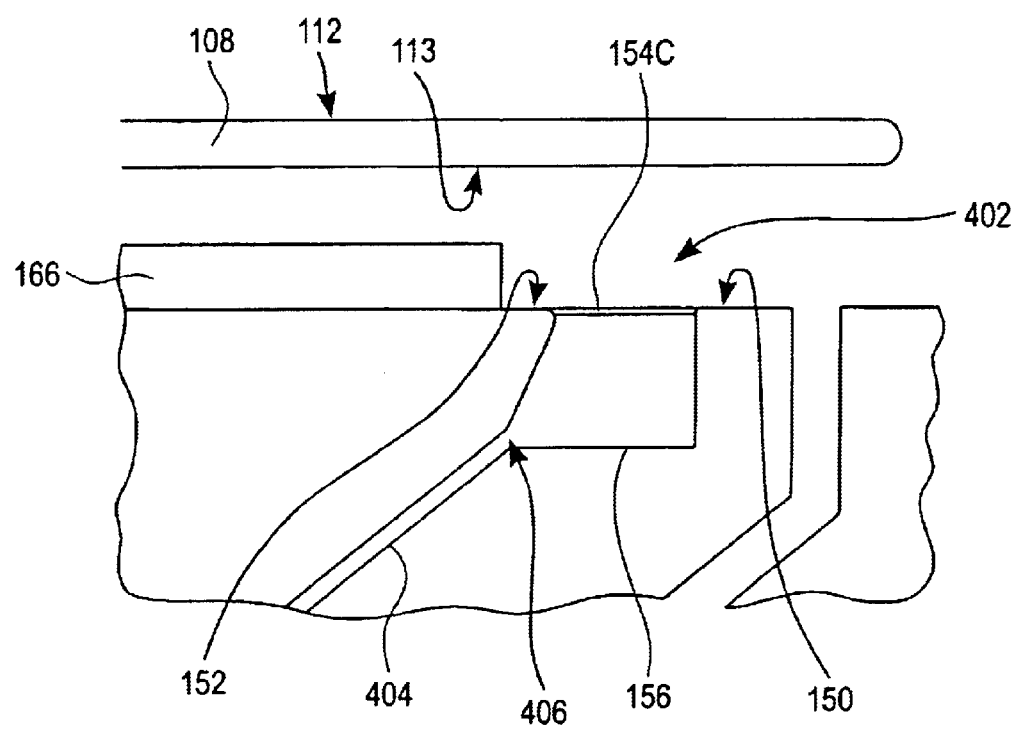
FIGS. 7A and 7B illustrate another embodiment of the present invention using an inflatable gasket member.

As shown in FIG. 7A, in an alternative embodiment, a gasket member 154C may be an inflatable membrane. FIG. 7A shows the inflatable membrane in deflated stage. The inflatable membrane 154C is attached to and seals the perimeter edge of opening 402 of the circular grove 156. In this embodiment the circular groove is connected to a fluid line 404 through at least one inlet port 406 so that a fluid such as air can be used to inflate the inflatable membrane 154C. The fluid line 404 is further connected to a fluid supply system (not shown) such that the fluid pressure can be controlled.

Figure 7B:
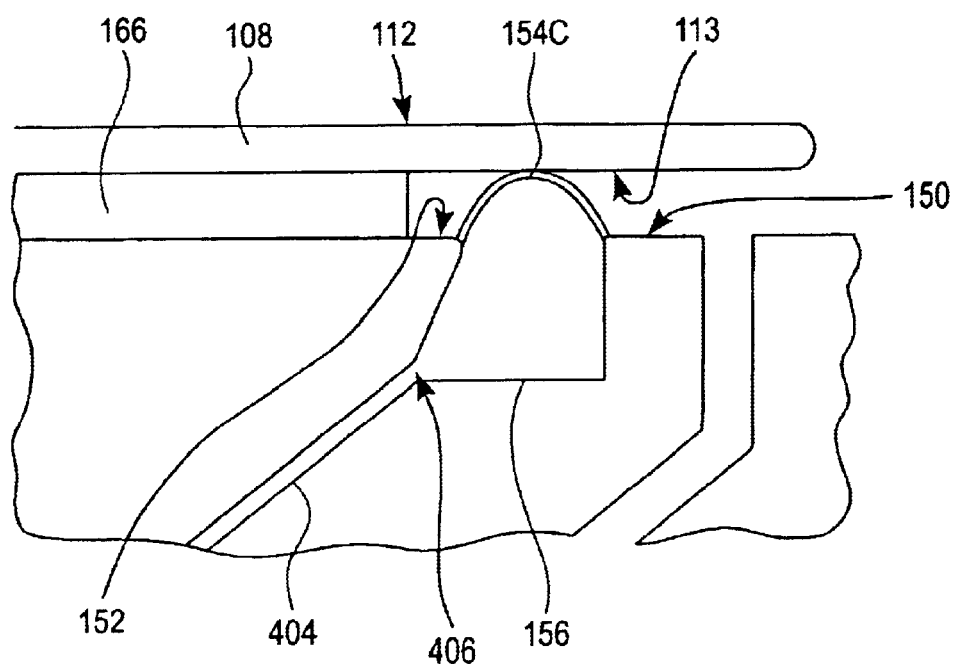

FIG. 7B shows the inflatable member 154C in inflated stage and when sealing the back surface 113 of the wafer 108. As vacuum suction is applied, the wafer 108 presses against the inflatable membrane thereby achieving sealing function. By controlling the fluid pressure, the force applied by the member 154C to the back of the wafer 108 may be optimized. This, in turn, provides efficient sealing without causing the above explained prior art wafer sinking problem. The inflatable member 154C may be made of any rubber or elastomer material.

It is also noted that it is within the scope of the present invention, as described above with reference to FIGS. 3A–7B to use any of the sealing members 154 as described injecting gas through the ports 159.

FIGS. 8A–8D illustrate another embodiment of the present invention using a pair of concentric sealing members. In this embodiment, as illustrated, a carrier head 500 comprises a carrier body 502 and a carrier base 504 where a wafer or other workpiece 505 is held. The carrier head 500 is rotated or moved through the shaft 508. The carrier base 504 comprises a bottom surface 506 that is preferably a surface that conforms to the shape of the workpiece, typically circular for a wafer. A first sealing member 508 and a second sealing member 509 are concentrically placed adjacent outer circumference 510 of the bottom surface 506.

The first sealing member 508 is preferably an inflatable gasket membrane having a circular strip shape. The membrane 508 is attached to the bottom surface 506 of the carrier base 504 from its inner and outer circumferential edges 512 and 514, respectively, such that an inner pocket 516 of the membrane 508 is formed. The inner pocket 516 of the membrane 508 is connected to a fluid source (not shown), such as a gas source, through fluid lines 518. As will be described below, the fluid from the fluid lines 518 is used to inflate the inflatable membrane 508 during the process. The second sealing member 509 is preferably made such as one of the sealing members 154 described above. In a particularly preferred embodiment, the second sealing member is made as the hollow o-ring 154A as described in FIGS. 3A and 4A. The second sealing member 509 is preferably placed in a circular groove 520. A support member 522 may be concentrically placed within the circular area formed by the o-ring 509. A number of vacuum lines 524 are formed through the carrier base 504 and through the support member 522 so that when the wafer 505 is placed on the support member 522, vacuum suction can be created on back side 526 of the wafer 505, which is sealed by the second sealing member 509.

Figure 8A:
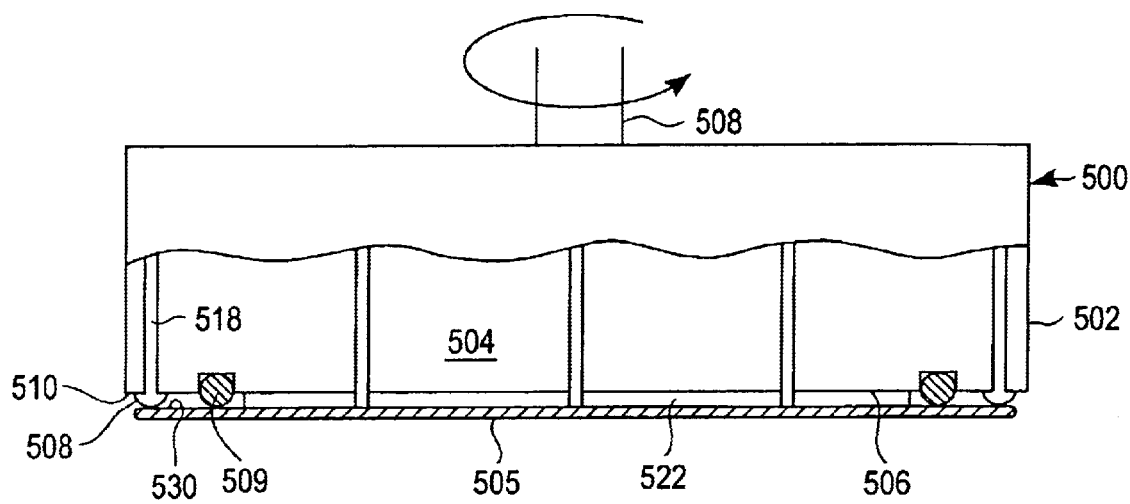
FIGS. 8A–8D illustrate another embodiment of the present invention using a pair of concentric gasket members.
Figure 8B:
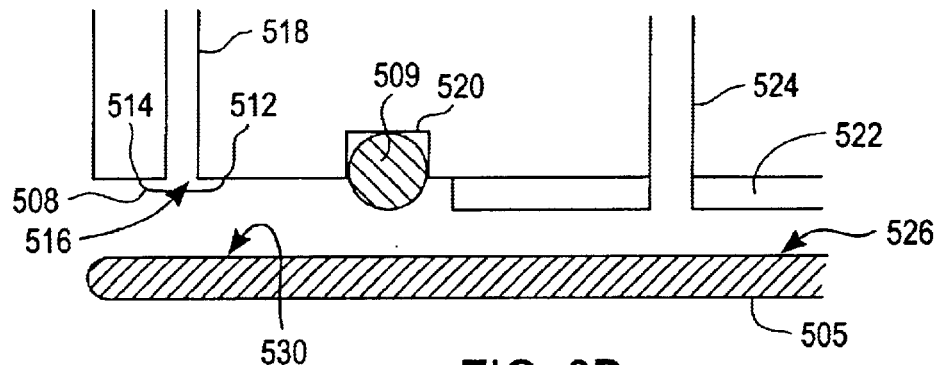
Figure 8C:
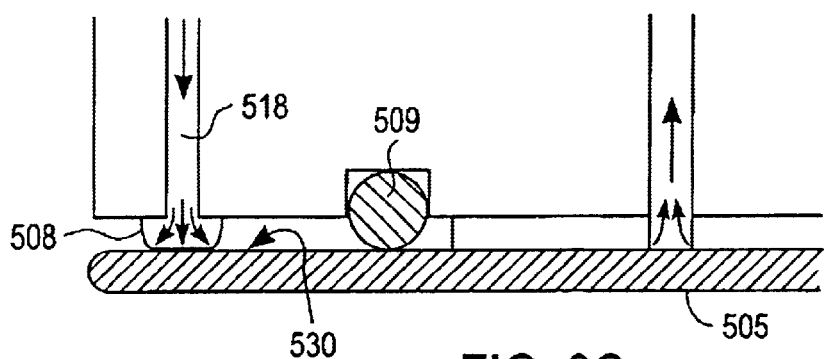

As shown in FIGS. 8A–8D, in operation, described in the preferred embodiment of the first sealing member 508 being an inflatable member and the second sealing member 509 being an o-ring, the back side 526 of the wafer 505 is placed on the o-ring 509 and vacuum suction is applied to hold the wafer 505 on the carrier 500. It is understood that in this embodiment, front surface 528 of the wafer 505 is fully exposed. As shown in FIG. 8C, next the inflatable membrane 508 is inflated by supplying gas into the inner pocket 516. In inflated state the inflatable membrane 509 effectively seals edge region 530 of the wafer 505. In this respect, the combination of both the inflatable membrane 508 and the o-ring 509 form a double seal along the circumference/edge of the wafer 505. Such combination advantageously prevents leakage of the process solutions, such as electrolyte, through both the inflatable member 508, and the o-ring 509 and prevents contamination of the backside 526 of the wafer as well as of the support member 522. And, even if there is some leakage within the inflatable member 508 of the process solution into the edge region 530 that exists between the inflatable member 508 and the o-ring 509, this edge region 530 can be easily cleaned, such as during a cleaning step after a plating step, as explained hereinafter.

Figure 8D:
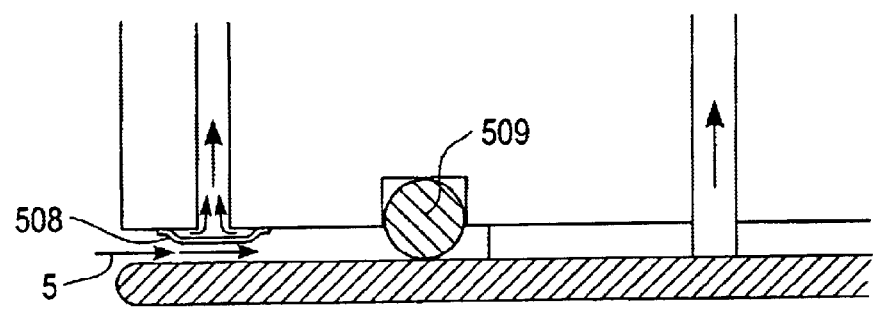

As shown in FIG. 8D, it becomes apparent why the first sealing member 508 is preferably an inflatable member.

After a plating step, in which both the first sealing member 508, and the second sealing member 509 are providing a seal, is completed, the first sealing member 508, when an inflatable member, can be deflated, as shown. This exposes a potentially contaminated edge region 530 while the wafer is still being held by the carrier 500 and the vacuum suction is still being applied to the area sealed by the o-ring 509. Thus, in this configuration, cleaning of the edge region 530 can occur by applying a cleaning fluid or fluids (such as either a liquid cleaning fluid, or both a liquid cleaning fluid and thereafter a gas such as air for drying) in the direction of arrow 5 into the edge region 530 from a cleaning system (not shown) into the area that had previously been protected to the inflated inflatable member 508. During the cleaning and a subsequent drying step the carrier 500 may also be spun. Although in this embodiment the first sealing member 508 is preferably an inflatable membrane, for the reasons described above, other alternative seals, for example an o-ring, can also be used.

Figure 9A:
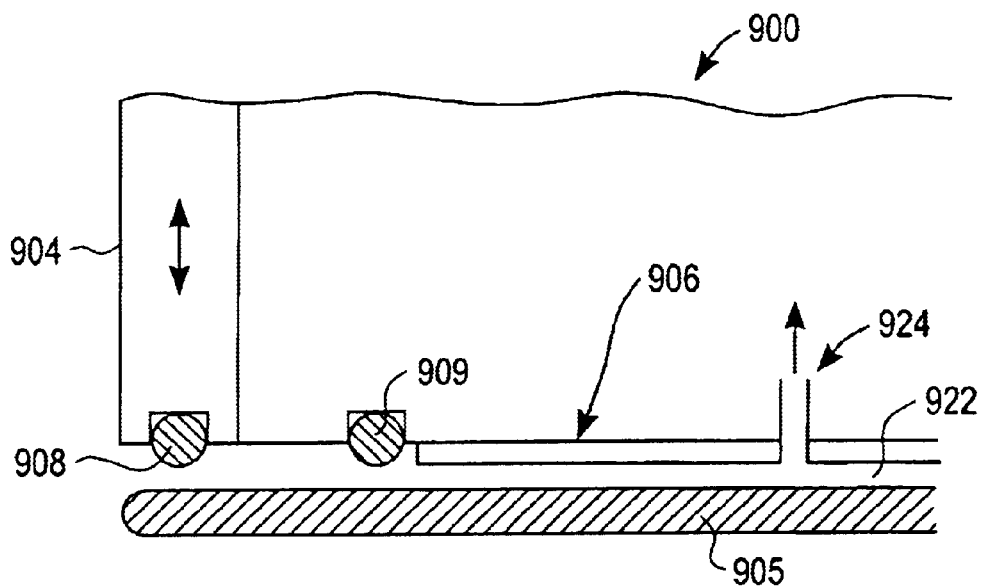
FIGS. 9A–9C illustrate another embodiment of the present invention using a pair of concentric gasket members.
Figure 9B:
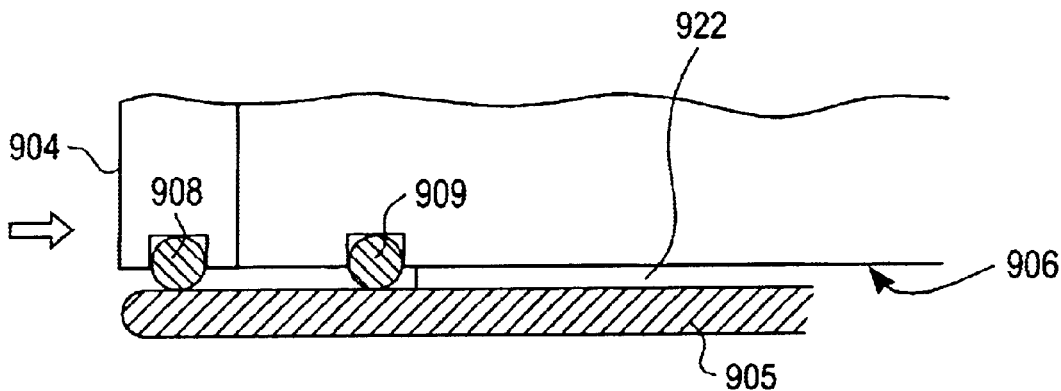
Figure 9C:
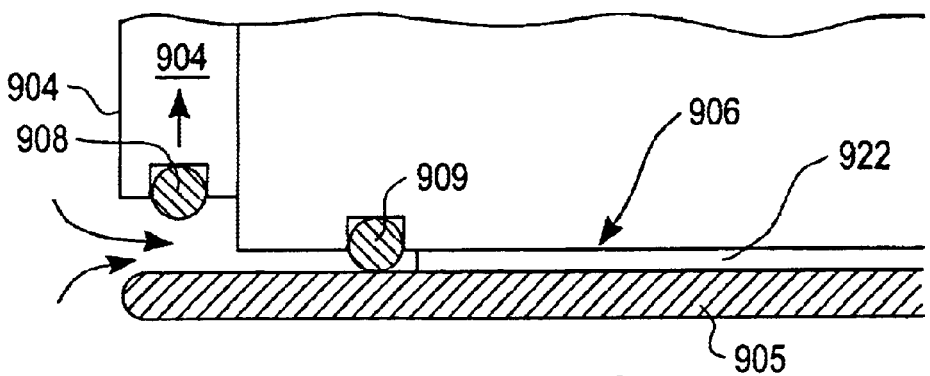

FIGS. 9A–9C illustrate another embodiment of the present invention using a pair of concentric gasket members. This embodiment is similar to the FIG. 8 embodiment, as shown in the overview of FIG. 9A, in using a first seal member 908 and a concentric second seal member 909 to provide a seal for the backside of the wafer 905 within the interior region formed by the second seal member 909, which interior region includes a support member 922. As in the previous embodiments the backside of the wafer 905 is preferably held on the second sealing member 909 and the support member 922 through the usage of a vacuum that is applied through vacuum lines 924. In contrast to the FIG. 8 embodiment, however, instead of having an inflatable first sealing member, the first sealing member 908 is preferably an o-ring, which may or may not be hollow inside, but preferably has a softness that is softer than that of the second sealing member 909. The seal with the first sealing member 908 is also formed by having a vertically moveable annular housing 904 on the outside of the carrier head 900. The vertical movability can be achieved in a variety of manners, including a motorized sprocket along the inner radius of the annular housing 904, other mechanical mechanisms, or otherwise.

FIG. 9B illustrates in more detail the sealed position, in which both the first seal member 908 and the second seal member 909 provide the sealing function. In this sealed position, the vertically moveable annular housing 904 is moved downward, to establish the seal between the first sealing member 908 and the wafer 905. The wafer is processed in the chemical environment when both sealing members 908 and 909 seal the wafer 905. It is noted that there is no carrier ring with a surface portion that extends below the backside surface of the wafer 905, as is shown in FIG. 3A, to assist in preventing lateral movement of the wafer 905, and thus, the vacuum applied through vacuum lines 924 is solely used to prevent lateral movement of the wafer 905 relative to the carrier head 900. In the unsealed position, which allows a cleaning fluid, or gas, to be injected into the backside of the wafer outside of the second sealing member 909, as shown by the arrows in FIG. 9C, the vertically moveable annular housing is moved upward, thereby disengaging the first sealing member 908 and providing a gap through which the cleaning fluid or gas can be injected to the peripheral backside of the wafer 905, outside of the second sealing member 909.

Figure 10A:
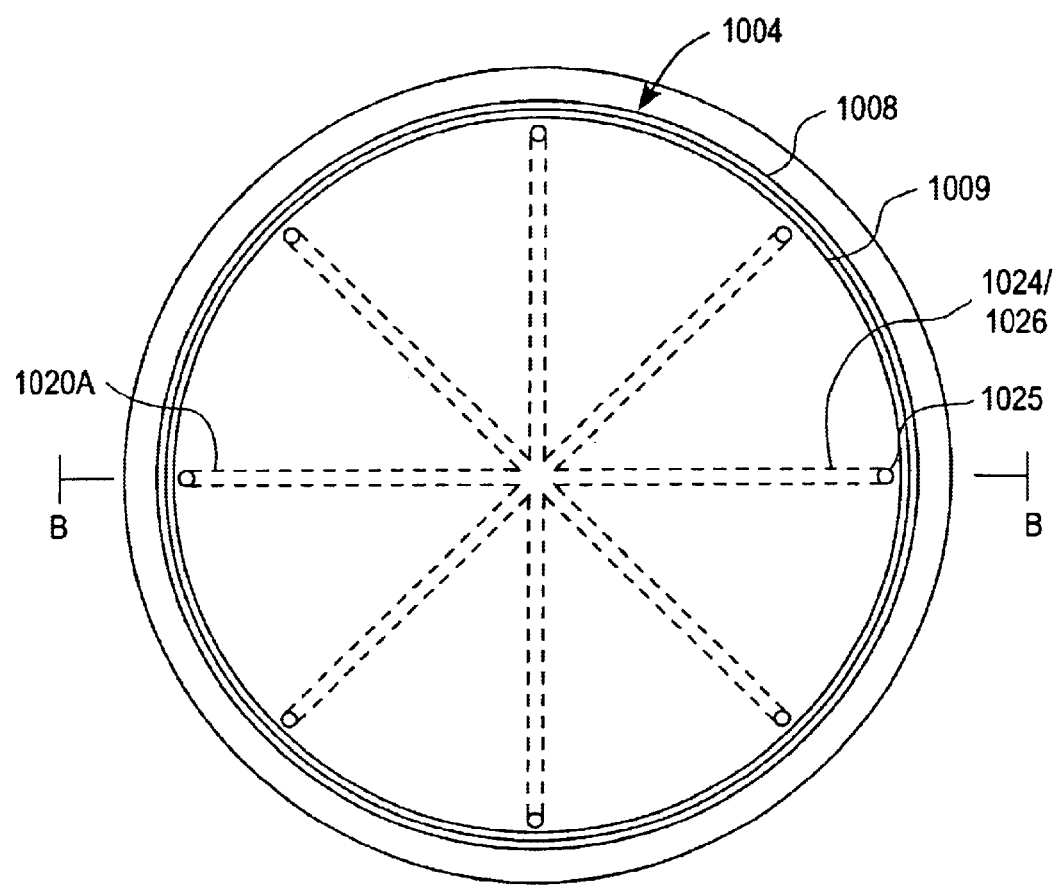
FIGS. 10A–10C illustrate another embodiment of the present invention using a pair of concentric gasket members that are positioned at a periphery of the backside of the wafer and vacuum openings that are only adjacent an inner region of the inner gasket member.
Figure 10B:
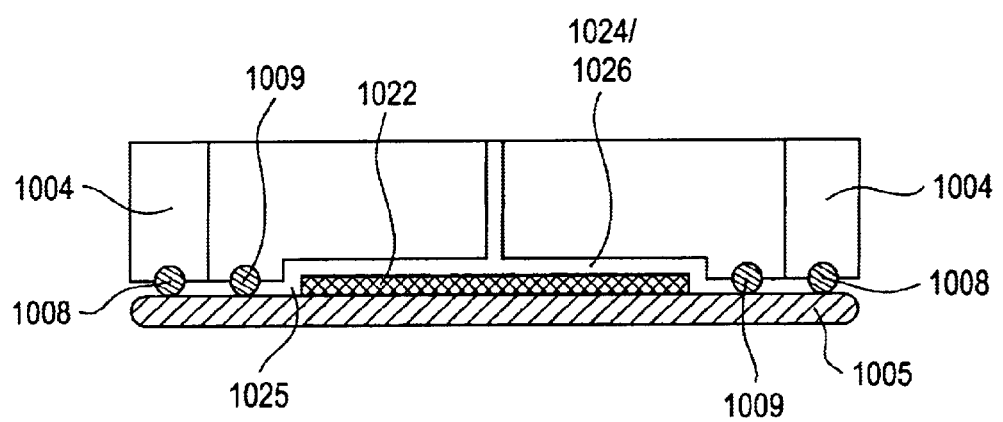

FIGS. 10A–B illustrate another embodiment of the present invention using a pair of concentric seal members 1008 and 1009 that are positioned at a periphery of the backside of the wafer 1005 and vacuum openings 1025 that are only adjacent an inner region of the inner seal member 1009. No such openings 1025 are located in further within the inner region of the wafer 1005. This embodiment is similar to the FIG. 9 embodiment, as shown in the overview of FIG. 10A, in using a first seal member 1008 and a concentric second seal member 1009 to provide a seal for the backside of the wafer 1005 within the interior region formed by the second seal member 909, which interior region includes a support member 1022. As in the previous embodiments, the backside of the wafer 1005 is preferably held on the second sealing member 1009 and the support member 1022 through the usage of a vacuum that is applied through vacuum lines 1024, except that the vacuum openings 1025 are only adjacent an inner region of the inner seal member 1009. The vacuum lines 1024 can be formed in a variety of manners, with either independent lines to each vacuum opening, but more preferably using a plurality of grooves 1026 that are formed in a bottom surface 1058 of the carrier base 1046, which grooves have disposed thereover the support pad 1022, which support pad has the openings 1025 disposed at locations at the periphery as mentioned above, which each align with a groove 1026. Thus, the combination of the grooves 1026 with the support pad 1022 disposed thereover forms a portion of the vacuum line 1024. It is noted that it is preferable for each of the grooves 1026 to terminate at its outer end 1026A such that the vacuum therefrom is not applied to the second sealing member 1009.

FIG. 10B illustrates in more detail the sealed position, in which both the first seal member 1008 and the second seal member 1009 provide the seal. In this sealed position, the vertically moveable annular housing 1004 is moved downward, to establish the seal between the first sealing member 1008 and the wafer 1005. The wafer is processed in the chemical environment when both sealing members 1008 (which is disposed on the annular housing 1004) and 1009 seal the wafer 1005. It is noted that there is no carrier ring with a surface portion that extends below the backside surface of the wafer 1005, as is shown in FIG. 3A, to assist in preventing lateral movement of the wafer 1005, and thus, the vacuum applied through vacuum lines 1024 to the vacuum openings 1025 that are adjacent the inner region of the sealing member 1009 is solely used to prevent lateral movement of the wafer 1005 relative to the carrier head 1000. In the unsealed position, which allows a cleaning fluid, or gas, to be injected into the backside of the wafer 1005 outside of the second sealing member 1009, the vertically moveable annular housing 1004 shown in FIG. 10B is moved upward just as the annular housing 904 is moved upward as illustrated in FIG. 9C, thereby disengaging the first sealing member 1008 and providing a gap through which the cleaning fluid or gas can be injected to the peripheral backside of the wafer 1005, outside of the second sealing member 1009.

With the vacuum openings only disposed adjacent to the second sealing member 1009, local vacuum only exists at the periphery of the backside of the wafer 1005. Thus, the inner region of the wafer 1005, which does not have any vacuum applied to it, will not deform in certain positions due to the existence of local vacuum caused by a opening that allows a vacuum to be applied there. As a result, irregularities in polishing that are caused by using a vacuum to attach the backside of a wafer 1005 to the wafer carrier head 1000 are minimized.

A modification of the embodiment illustrated in FIGS. 10A and 10B, which will provide sealing without certain of the cleaning advantages, is to use only a single seal, such as the sealing member 1009, without an outer annular housing 1004 or the first sealing member 1008. As with the embodiment described above in FIG. 10, irregularities in polishing that are caused by using a vacuum to attach the backside of a wafer 1105 to the wafer carrier head 1100 are minimized.

Figure 10C:
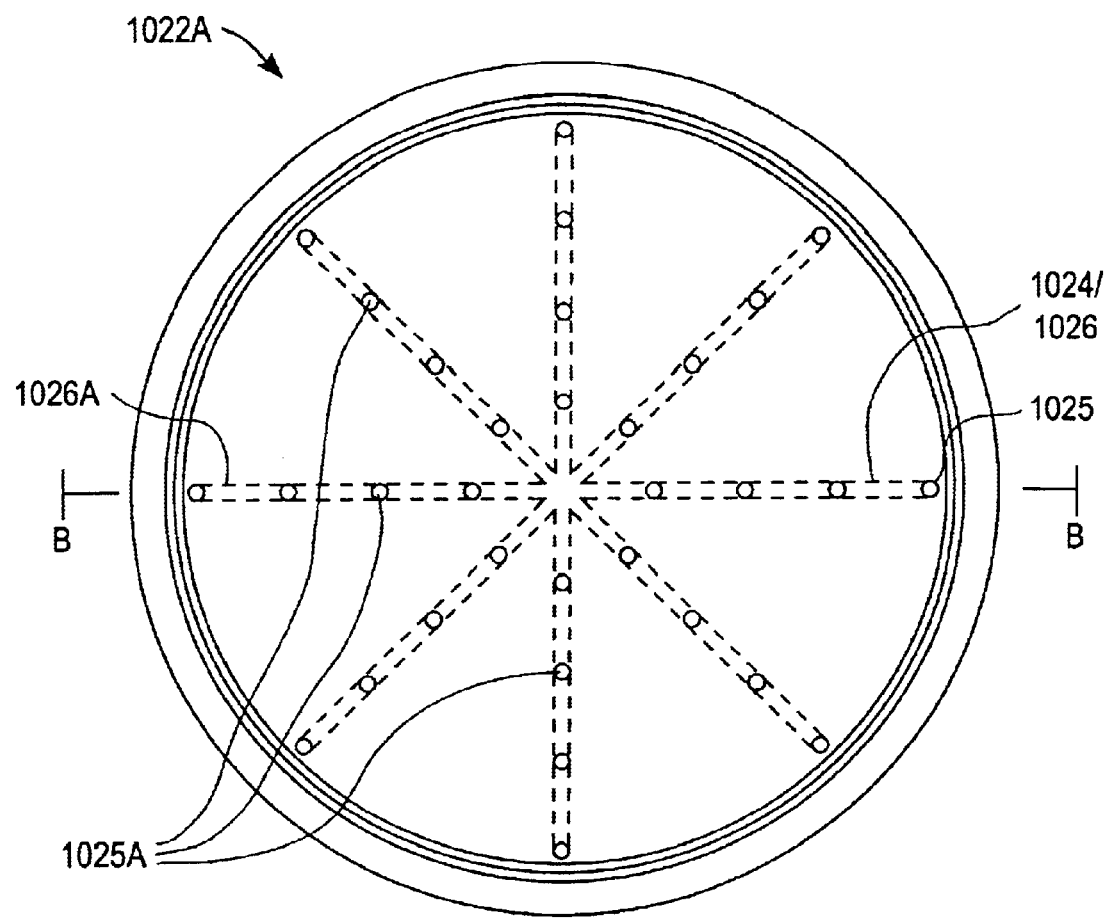

FIG. 10C illustrates another support plate 1022A, which support plate is modified from the support plate 1022 illustrated in FIGS. 10A–B, and, as will be described herein, thus allows a method to efficiently configure a wafer carrier head to obtain a desired vacuum opening arrangement. As described in FIGS. 10A–10B, the peripheral openings 1025 are made in the support pad 1022, and the support pad 1022 attached to a bottom surface 1058 of the carrier base 1046, such as by using an adhesive, such that the grooves 1026 along with the support pad 1022 disposed thereover, will form the vacuum lines 1024. The openings 1025 within the support pad 1022 at peripheral locations corresponding to the grooves 1126 are then used to create the local pressure only at the periphery of the wafer 1005, as described above with reference to FIGS. 10A–B.

If openings 1025 are instead desired at various locations over the entire backside surface of the wafer 1005, then, as illustrated in FIG. 10C, openings 1025A that are disposed within the inner region of the support pad 1022A that also intersect with the grooves 1126 can be formed for the creation of local pressure at each such location.

Thus, the same workpiece carrier 1000 can have one support pad 1022 with openings 1025 in one set of locations that is then taken off, with another support pad 1022A subsequently added that has openings 1025A in different locations, to change the local vacuum profile by only changing the support pad 1022. It is also that while usage of a support pad is preferred, any other type of support, such as a hard inert metal surface obtained from a plate with openings that correspond to the grooves as noted above could also be used to establish the surface that contacts the wafer and allow for the openings, in the desired configurations as discussed above, to exist that will provide the local vacuum profile. Also, although grooves in conjunction with a support pad are described as one manner of providing a pathway for the pressure to the openings, any variety of ways could be used to establish the pathway.

Figure 11A:
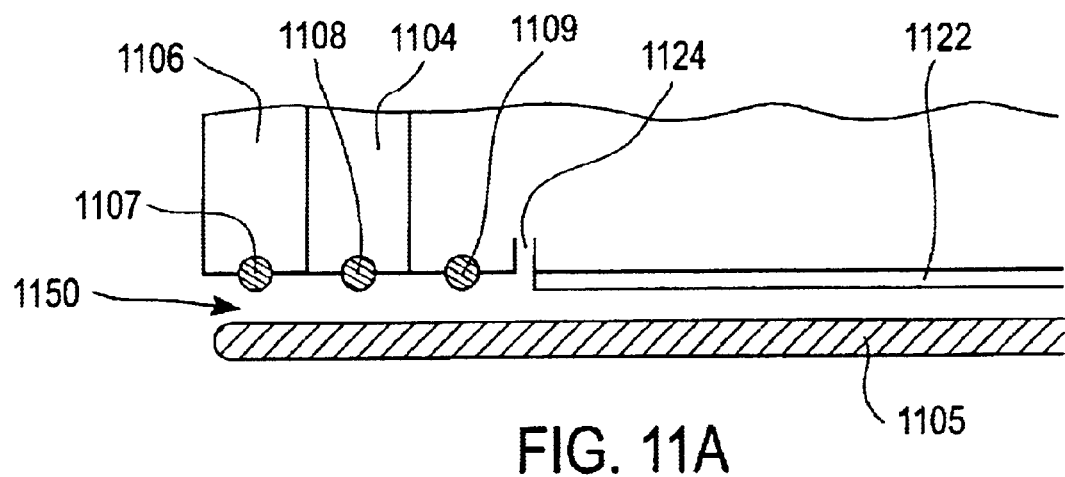
FIGS. 11A–11C illustrate a method of creating various carriers using a replaceable support pad.
Figure 11B:
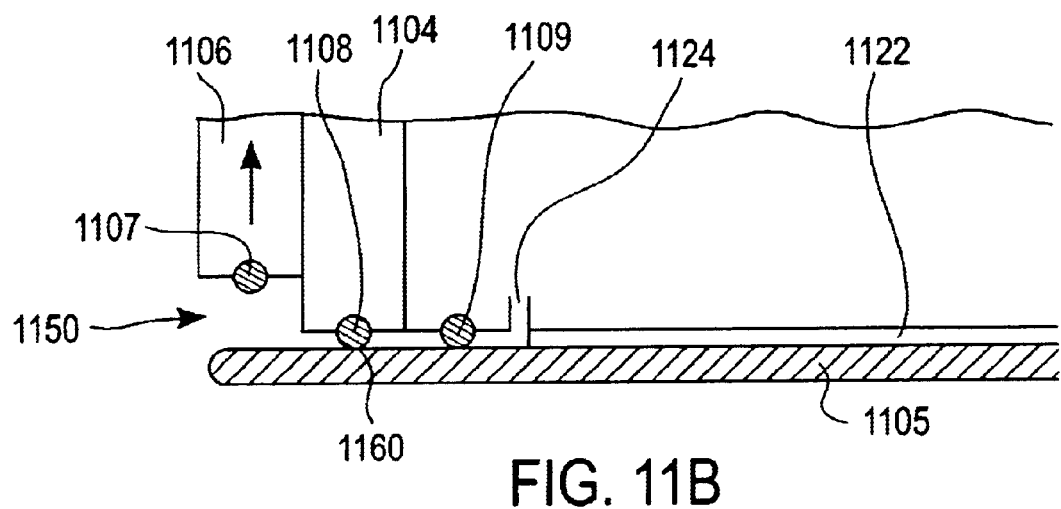
Figure 11C:
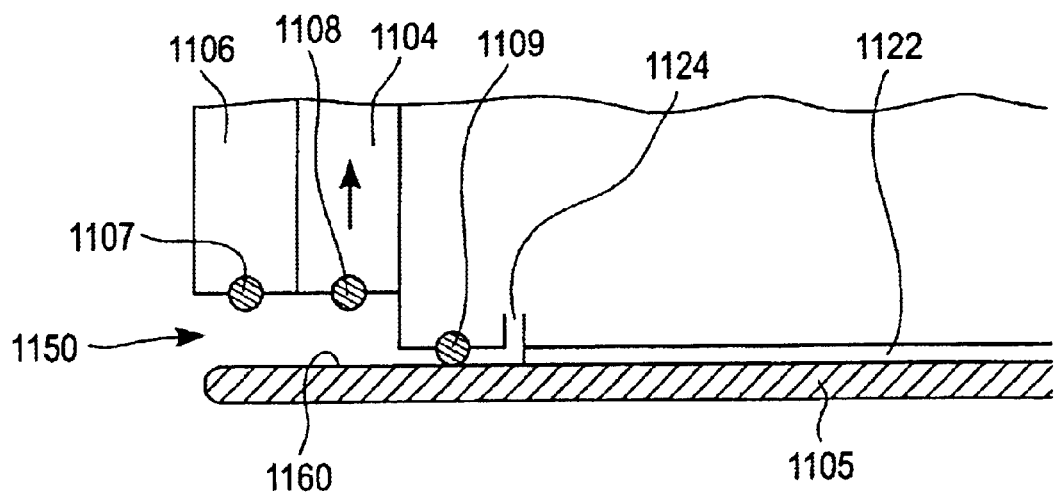

FIGS. 11A–11C illustrates another preferred embodiment, which provides a multi-stage seal. For purposes of description, three stages are illustrated, and preferably only three stages are used, although more stages could be added if desired. As shown in FIG. 3, in addition to the annular housing 1104 containing the second seal member 1108, which annular housing 1104 and seal 1108 correspond to the annular housing 904 and seal 908 illustrated in FIG. 9, there is included another annular housing 1106 with a third seal member 1107, which can move vertically with respect to the wafer 1105 independently of the movement of the annular housing 1104. It is noted, however, that two or more annular housings, such as 1104 and 1106, can, particularly if more than three annular housings are used, be moved together in synchronism.

In the initial position, the wafer 1105 illustrated in FIG. 11A is attached to the wafer carrier 1100 using a vacuum and the three seal members 1107, 1108 and 1109, based upon the same principles as described above. Once attached, the frontside of the wafer 1105 can be processed. As a result of processing, chemical deposits from the processing will build up in the area 1150 as shown.

Once processing is completed, cleaning the wafer 1105 can be initiated, which cleaning will include directing a cleaning solution to the backside of the wafer to clean away residue 1150 after the annular housing 1106 has been moved away from the wafer 1105 to break the seal between the seal member 1107 and the wafer 1105 as described above. Typically, the wafer will be rotated by the wafer carrier 1100 while the cleaning solution is directed to the bevel edge of the wafer 1105.

Once the cleaning solution has been used to clean the bevel edge of the wafer 1105, the wafer 1105 can continue to be rotated to dry substantially the entire surface of the wafer 1105. As shown in FIG. 11B, however, a small amount of residual cleaning solution will typically remain at location 1160 where the seal between the sealing member 1108 and the wafer 1105 exists. If the embodiment described in FIG. 9 was used, this small amount of cleaning solution would remain where the seal 909 contacts the wafer 905, which small amount would remain even after spin drying the wafer 905. In this embodiment, as shown in FIG. 11C, with the multi-stage seal, the seal 1108 can be broken with the wafer 1105 by moving the annular housing 1104. Thus, with this seal broken, any residual cleaning solution 1160 that remains on the wafer 1105 can be removed by spin drying the wafer 1105. With no residual cleaning solution on the wafer 1105, when the seal 1109 is thereafter broken and the wafer 1105 removed, it will have dried with no residual cleaning solution thereon.

Thereafter, when unloading, the vacuum suction can be eliminated and pressure applied through the vacuum lines or openings, such as vacuum line 1124 illustrated. In addition, however, while applying the pressure, an annular housing, such as annular housing 1106, that ha has previously been raised can be lowered, such that the associated seal, such as sealing member 1107, will touch the wafer 1105, and pressure from the annular housing 1106 can be applied to assist in removing the wafer 1105 from the wafer carrier. Alternatively, instead of applying pressure, the vacuum suction can be eliminated, and then the force from the annular housing, such as annular housing 1106, can be used to remove the wafer 1105 from the wafer carrier.

With the cleaning embodiment described in FIGS. 11A–11C, although movable annular housings are illustrated as being used to create the intermittently permanent sealing, other intermittent permanent seals can be used, such as the inflatable membrane described previously with respect to FIGS. 8A–8C.

Figure 12A:
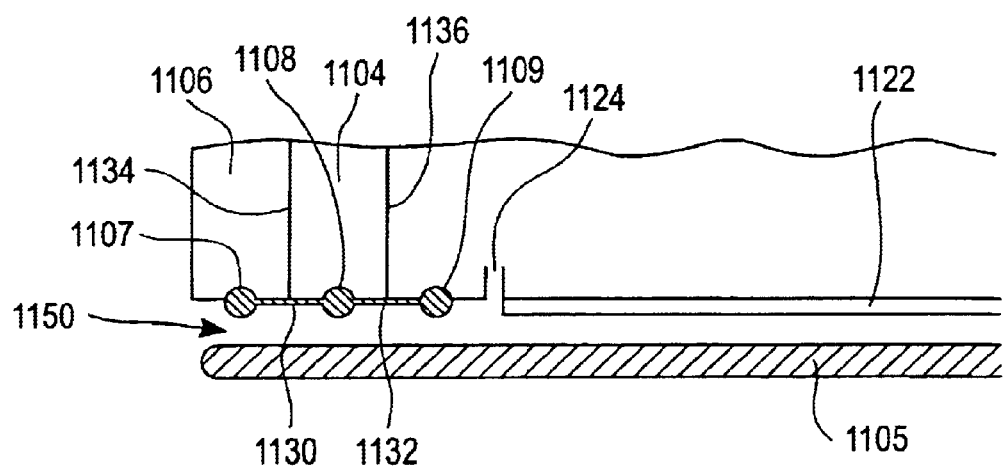
FIGS. 12A–12B illustrates other embodiments in which a thin, expandable membrane is used to protect between annular housings.
Figure 12B:
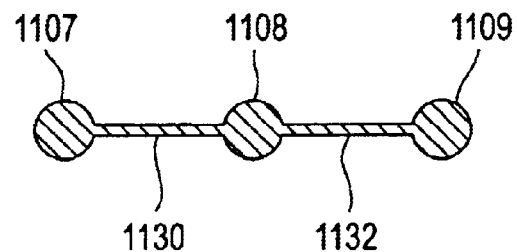

FIG. 12A illustrates another embodiment in which a thin, expandable membrane is used to protect between annular housings. FIG. 12 uses the same reference designations as FIG. 11A, and further illustrates thin, expandable membranes 1130 and 1132, made from a material such as rubber, or from the same material that is used to make the seal. These membranes 1130 and 1132 are shown as being attached between adjacent o-rings 1107 and 1108, and also 1108 and 1109 respectively. They can also be attached at any location between adjacent annular housings, and are used to protect the areas between adjacent annular housings such as 1134 and 1136 as shown. These membranes can be used with our without the support pad 1122 being located between the adjacent o-rings, or other types of adjacent sealing members. Further, a composite 1150 that includes both the membranes 1130 and 1132 and the sealing members, such as 1107 and 1108, can also be formed, such as illustrated in FIG. 12B, although it is understood that only a single membrane can be used with two sealing members, or a greater number of membranes used with a greater number of sealing members.

With respect to the various sealing members described herein, it is further noted that each is preferably coated with a material that allows for chemical compatibility with the process being performed, such as Teflon® for chemical compatibility with plating that uses an electrolyte as well as cleaning with conventional cleaning solutions.

Although various preferred embodiments have been described in detail above, those skilled in the art will readily appreciate that many modifications of the exemplary embodiment are possible without materially departing from the novel teachings and advantages of this invention. For example, although an o-ring, gasket, and inflatable member are described to provide the vacuum seal, any material or device that may provide this sealing may replace o-ring and be within the scope of this invention. It will thus be appreciated that in some instances some features of the invention will be employed without a corresponding use of other features without departing from the spirit and scope of the invention as set forth in the appended claims.

What is claimed is:

1. A substrate carrier that is capable of receiving a vacuum and holding a substrate from a backside for processing a frontside of the substrate, using a solution, the substrate carrier comprising:

a base of the substrate carrier for placing the substrate thereon;

a sealing member disposed on the base and defining an inner region of the base, the sealing member adapted to contact the backside of the substrate to thereby establish a backside inner region of the substrate, and assist in preventing the solution from reaching the backside inner region of the substrate during the processing of the substrate; and multiple sealing members disposed outside the sealing member and adapted to assist in preventing the solution from reaching the backside inner region of the substrate during the processing of the substrate, wherein the multiple sealing members include at least two outer sealing members, the at least two outer sealing members disposed outside of and around the scaling member and adapted to contact the backside of the substrate and thereby assist in preventing the solution from reaching the backside inner region of the substrate, wherein one or more of the at least two outer sealing members is an inflatable sealing member.

2. The substrate carrier according to claim 1 wherein the one or more inflatable sealing member is inflated during the processing of the substrate, and is not inflated during a subsequent processing of the substrate.

3. The substrate carrier according to claim 1 wherein the one or more inflatable sealing member is inflated by a gas that is provided through at least one hole that is formed in the base.

4. A method of processing a frontside of a substrate using a processing solution and cleaning a peripheral backside of a substrate using a cleaning solution, the method comprising the steps of:

attaching the substrate to a substrate holder, the substrate holder including an inner sealing member, a middle sealing member, and an outer sealing member, such that the inner sealing member continuously applies a seal during processing and cleaning and the middle and outer sealing members are moveable relative to the inner sealing member and wherein the middle and outer sealing members can intermittently apply a seal;

applying the seal using the middle and outer sealing members;

processing the frontside of the substrate using the processing solution when the seal is applied by the middle and outer sealing members, thereby substantially preventing the processing solution from reaching the inner sealing member;

upon completion of processing the frontside of the substrate, removing the seal applied by the outer sealing member;

cleaning the peripheral backside of the substrate using the cleaning solution when the seal applied by the outer sealing member remains removed and the seal applied by the middle and the inner sealing members is retained;

upon completion of cleaning the frontside of the substrate, removing the seal applied by the middle sealing member; and spin-drying the substrate when the seal applied by the outer and middle sealing members remains removed and the seal applied by the inner sealing member is retained.

5. The method according to claim 4 wherein the step of processing the frontside of the substrate performs one of electrochemical deposition and electrochemical mechanical deposition of a conductor using an electrolyte as the processing solution.

6. The method according to claim 5 wherein:

the step of applying the seal by the outer and middle sealing members uses a gas that is emitted from the substrate holder to a peripheral backside of the substrate; and the steps of removing the seals applied by each sealing member stop the emission of the gas from the substrate holder.

7. The method according to claim 5 wherein:

the step of applying the seal by the outer and middle sealing members comprises inflating an inflatable membrane for each sealing member; and the steps of removing the seals comprises deflating the respective inflatable membranes.

8. The method according to claim 5 wherein:

the step of applying the seal by the outer and middle sealing members moves an outer moveable housing carrying the outer sealing member into an outer seal position and moves a middle moveable housing carrying the middle sealing member into a middle seal position; and the steps of removing the seals comprises retracting the outer and middle moveable housings and the respective sealing members into unsealed positions.

9. The method according to claim 4 wherein the step of processing the frontside of the substrate performs one of electrochemical etching and electrochemical mechanical etching of a conductor using one of an electroetching solution and an electrolyte as the processing solution.

10. The method according to claim 9 wherein the step of processing the frontside of the substrate performs chemical mechanical polishing of a conductor using one of a polishing solution and a slurry.

11. The method according to claim 10 wherein:

the step of applying the seal by the outer and middle sealing members uses a gas that is emitted from the substrate holder to a peripheral backside of the substrate; and the steps of removing the seals applied by each sealing member stop the emission of the gas from the substrate holder.

12. The method according to claim 10 wherein:
the step of applying the seal by the outer and middle sealing members comprises inflating an inflatable membrane for each sealing member; and
the steps of removing the seals comprises deflating the respective inflatable membranes.

13. The method according to claim 10 wherein:
the step of applying the seal by the outer and middle sealing members moves an outer-moveable housing carrying the outer sealing member into an outer seal position and moves a middle moveable housing carrying the middle sealing member to a middle seal position; and
the steps of removing the seals retracts the outer and middle moveable housings and the respective sealing members into respective unsealed positions.

14. The method according to claim 4 wherein:
the step of applying the seal by the outer and middle sealing members uses a gas that is emitted from the substrate holder to a peripheral backside of the substrate; and
the steps of removing the seals applied by each sealing member stop the emission of the gas from the substrate holder.

15. The method according to claim 4 wherein:
the step of applying the seal the outer and middle sealing members comprises inflating an inflatable membrane for each member; and
the steps of removing the seals comprises deflating the respective inflatable membranes.

16. The method according to claim 4 wherein:
the step of applying the seal the outer and middle sealing members an outer moveable housing carrying the outer sealing member into an outer seal position and moves a middle moveable housing carrying the middle sealing member to a middle seal position; and
the steps of removing the seals retracts the outer and middle moveable and the respective sealing members into respective unsealed positions.

17. The method according to claim 4 wherein the step of attaching attaches the substrate to the substrate holder using a vacuum.

18. The method according to claim 17 wherein the vacuum prevents the substrate from lateral displacement relative to the substrate holder during the steps of processing and cleaning.

19. The method according to claim 18 wherein the vacuum thereby does not require the usage of a retaining ring and flow of the processing solution is not obstructed during the step of processing.

20. The method according to claim 18 wherein the step of processing performs full face processing of the frontside of the substrate.

21. The method according to claim 20 wherein the vacuum thereby does not require the usage of a retaining ring and flow of the processing solution is not obstructed during the step of processing.

22. The method according to claim 4, wherein, after the step of spin-drying, further including the step of removing the wafer from substrate holder, the step of removing including applying pressure from at least one of the inner, middle and outer sealing members onto the backside of the substrate.

23. A method of holding a substrate on a substrate holder for processing a frontside of the substrate using a processing solution, comprising the steps of:

attaching the substrate to the substrate holder, the substrate holder including multiple sealing members, an inner sealing member of the multiple sealing members contacting the substrate and applying a permanent seal to a backside region of the substrate with vacuum causing the substrate holder to hold the backside region of the substrate; and processing the frontside of the substrate using the processing solution while the permanent seal exists, thereby substantially preventing the processing solution from reaching the backside region, wherein the step of processing the frontside of the substrate performs chemical mechanical polishing of the frontside of the substrate using a pad, and wherein the frontside of the wafer and the pad are in contact with and move relative to each other.

24. The method according to claim 23 wherein the processing solution is a slurry.

25. A method of holding a substrate on a substrate holder for processing a frontside of the substrate using a processing solution, comprising the steps of:

attaching the substrate to the substrate holder, the substrate holder including multiple sealing members, an inner sealing member of the multiple sealing members contacting the substrate and applying a permanent seal to a backside region of the substrate with vacuum causing the substrate holder to hold the backside region of the substrate; and processing the frontside of the substrate using the processing solution while the permanent seal exists, thereby substantially preventing the processing solution from reaching the backside region, wherein the permanent seal provided by the inner sealing member and the vacuum during the step of attaching holds the substrate to the substrate holder without a clamp during the processing, and thereby provides for full face processing of the frontside of the substrate, wherein the permanent seal provided by the inner sealing member and the vacuum solely prevents lateral movement of the substrate during processing relative to the substrate holder, and wherein the step of processing the frontside of the substrate performs chemical mechanical polishing of the frontside of the substrate using a pad, and wherein the frontside of the wafer and the pad are in contact with and move relative to each other.

26. The method according to claim 25 wherein the processing solution is a slurry.

27. A method of holding a substrate on a substrate holder for processing a frontside of the substrate using a processing solution, comprising the steps of:

attaching the substrate to the substrate holder, the substrate holder including multiple sealing members, an inner sealing member of the multiple sealing members contacting the substrate and applying a permanent seal to a backside region of the substrate with vacuum causing the substrate holder to hold the backside region of the substrate; and processing the frontside of the substrate using the processing solution while the permanent seal exists, thereby substantially preventing the processing solution from reaching the backside region, wherein the permanent seal provided by the inner sealing member and the vacuum during the step of attaching holds the substrate to the substrate holder without a clamp during the processing, and thereby provides for full face processing of the frontside of the substrate, wherein the permanent seal provided by the inner sealing member and the vacuum solely prevents lateral movement of the substrate during processing relative to the substrate holder, and wherein the step of processing uses a pad for polishing of the substrate and performs one of electrochemical deposition and electrochemical mechanical deposition of a conductor using an electrolyte as the processing solution.

28. A method of holding a substrate on a substrate holder for processing a frontside of the substrate using a processing solution, comprising the steps of:

attaching the substrate to the substrate holder, the substrate holder including multiple sealing members, an inner sealing member of the multiple sealing members contacting the substrate and applying a permanent seal to a backside region of the substrate with vacuum causing the substrate holder to hold the backside region of the substrate; and processing the frontside of the substrate using the processing solution while the permanent seal exists, thereby substantially preventing the processing solution from reaching the backside region, wherein the permanent seal provided by the inner sealing member and the vacuum during the step of attaching holds the substrate to the substrate holder without a clamp during the processing, and thereby provides for full face processing of the frontside of the substrate, wherein the permanent seal provided by the inner sealing member and the vacuum solely prevents lateral movement of the substrate during processing relative to the substrate holder, and wherein the step of processing the frontside of the substrate performs one of electrochemical polishing and electrochemical mechanical polishing of the frontside of the substrate using a pad for polishing of the substrate.

29. An apparatus for holding a substrate from a backside using a vacuum during processing of a frontside of the substrate with a solution and a pad that contacts and moves relative to the frontside of the substrate, comprising:

a base for placing the substrate thereon; and means for simultaneously holding the substrate on the base during the processing of the frontside of the substrate using the vacuum and preventing lateral movement of the substrate relative to the base during the processing using the vacuum, the means for holding including:

an inner sealing member disposed on the base and defining the inner region of the base and adapted to contact the backside of the substrate to thereby establish the backside inner region of the substrate; and a sealing mechanism carrying at least two sealing members disposed outside the inner sealing member and adapted to assist in preventing the solution from reaching the backside inner region of the substrate during the processing of the substrate, wherein the sealing mechanism includes a middle sealing member and an outer sealing member disposed outside of and around the inner sealing member and adapted to contact the peripheral backside of the substrate and thereby assist in preventing the solution from reaching the backside inner region of the substrate, wherein at least one of the middle and outer sealing members is an inflatable sealing member.

30. The apparatus according to claim 29 wherein one or more of the at least one inflatable sealing member is inflated during the processing of the substrate, and is not inflated during a subsequent processing of the substrate.

31. An apparatus for holding a substrate from a backside using a vacuum during processing of a frontside of the substrate with a solution and a pad that contacts and moves relative to the frontside of the substrate, comprising:

a base for placing the substrate thereon; and means for simultaneously holding the substrate on the base during the processing of the frontside of the substrate using the vacuum and preventing lateral movement of the substrate relative to the base during the processing using the vacuum, the means for holding including:

an inner sealing member disposed on the base and defining the inner region of the base and adapted to contact the backside of the substrate to thereby establish the backside inner region of the substrate; and a sealing mechanism carrying at least two sealing members disposed outside the inner sealing member and adapted to assist in preventing the solution from reaching the backside inner region of the substrate during the processing of the substrate, wherein the sealing mechanism includes a middle sealing member and an outer sealing member disposed outside of and around the inner sealing member and adapted to contact the peripheral backside of the substrate and thereby assist in preventing the solution from reaching the backside inner region of the substrate, wherein at least one of the middle and outer sealing members is an o-ring.

32. The apparatus according to claim 31 wherein the inner sealing member is a hollow o-ring.

33. The apparatus according to claim 32 wherein the sealing inner, middle and outer sealing members are made from an elastomer material.

34. The apparatus according to claim 33 wherein the middle and outer sealing members are hollow o-rings.

35. The apparatus according to claim 32 wherein the hollow o-ring has a durometer rating of less than 50.

36. A method of processing a frontside of a plurality of substrates using a processing solution while holding each of the substrates to a substrate holder using a vacuum comprising the steps of:

attaching at least one of the substrates to the substrate holder using the vacuum, the substrate holder including a support pad and a plurality of sealing members, and inner sealing member of the plurality of sealing members having a surface that contacts the substrate such that the inner sealing member provides a permanent seal of a backside region of the substrate with the vacuum causing the substrate holder to hold the backside region of the substrate and the support pad including a first configuration of openings through which the vacuum connects to the substrate;

processing the frontside of the one substrate using the processing solution while sealing the backside region with the plurality of sealing members, thereby substantially preventing the processing solution from reaching the backside region of the substrate;

changing the support pad on the substrate holder with another support pad having a second configuration of opening different from the first configuration of openings;

attaching at least another of the substrates to the substrate holder using the vacuum, the substrate holder including the another support pad and the plurality of sealing members with the inner sealing member having the surface that contacts the another substrate such that the inner sealing member provides another permanent seal of the backside region of the another substrate with the vacuum causing the substrate holder to hold the backside region of the another substrate; and processing the frontside of the another substrate using the processing solution while the another permanent seal exists, thereby substantially preventing the processing solution from reaching the backside region of the another substrate.

37. A substrate carrier that is capable of receiving a vacuum and holding a substrate from a backside for processing a frontside of the substrate using a solution, the substrate carrier comprising:

a base for placing the substrate thereon;

a first sealing member disposed on the base and defining an inner region of the base, and adapted to contact the backside of the substrate to thereby establish a backside inner region of the substrate, and assist in preventing the solution from reaching the backside inner region of the substrate during the processing of the substrate;

a sealing mechanism disposed outside of the sealing member and adapted to assist in preventing the solution from reaching the backside inner region of the substrate during the processing of the substrate, the sealing mechanism including a second and third sealing members disposed in a moveable housings that are adapted to position the second and third sealing members in respective seal positions and respective unsealed positions, the second and third sealing members disposed outside of and around the first sealing member and adapted to contact the backside of the substrate and thereby assist in preventing the solution from reaching the backside inner region of the substrate; and an expandable membrane disposed between the first, second and third sealing members.

38. The apparatus according to claim 37 wherein the first, second and third sealing members and the expandable membrane are formed as an integral piece.

39. The substrate carrier according to claim 37, wherein a vacuum inlet disposed within the inner region of the base and connectable to the vacuum to allow the backside of the substrate to be held on the base.

40. A substrate carrier that is capable of receiving a vacuum and holding a substrate from a backside for processing a frontside of the substrate, using a solution, the substrate carrier comprising:

a base of the substrate carrier for placing the substrate thereon;

a sealing member disposed on the base and defining an inner region of the base, the sealing member adapted to contact the backside of the substrate to thereby establish a backside inner region of the substrate, and assist in preventing the solution from reaching the backside inner region of the substrate during the processing of the substrate; and multiple sealing members disposed outside the sealing member and adapted to assist in preventing the solution from reaching the backside inner region of the substrate during the processing of the substrate, wherein the multiple sealing members are disposed in moveable housings that are adapted to position the multiple sealing members into a seal position and an unsealed position.

41. The substrate carrier according to claim 40 wherein the moveable housings are adapted to move together, thereby positioning the multiple sealing members into the seal position and the unsealed position together.

42. The substrate carrier according to claim 40 wherein the moveable housings are adapted to move independently, thereby positioning the multiple sealing members into the seal position and the unsealed position independent of one another.

43. A method of holding a substrate on a substrate holder for processing a frontside of the substrate using a processing solution, comprising the steps of:

attaching the substrate to the substrate holder, the substrate holder including multiple sealing members, an inner sealing member of the multiple sealing members contacting the substrate and applying a permanent seal to a backside region of the substrate with vacuum causing the substrate holder to hold the backside region of the substrate;

applying a seal to a peripheral backside of the substrate by a middle sealing member and an outer sealing member of the multiple sealing members, wherein the step of applying the seal by the middle and outer sealing members comprises moving the middle and outer sealing members to place them onto the peripheral backside of the substrate; and after applying the seal, processing the frontside of the substrate using the processing solution while the permanent seal exists, thereby substantially preventing the processing solution from reaching the backside region.

44. The method according to claim 43, wherein the step of moving comprises moving the middle and outer sealing members together.

45. The method according to claim 43, wherein the step of moving comprises moving the middle and outer sealing members independent of one another.

46. The method according to claim 43, further comprising removing the middle and outer sealing members from the peripheral backside of the substrate to expose the peripheral backside to a cleaning solution during a cleaning step.

47. The method according to claim 43, further comprising the step of removing the outer sealing member from the peripheral backside of the substrate to expose the peripheral backside to a cleaning solution during a cleaning step.

48. The method according to claim 47, further comprising the step of removing the middle sealing member from the peripheral backside of the substrate to allow drying of the peripheral backside during a spin-drying step.

* * * * *